(12) United States Patent
Lu

(10) Patent No.: US 12,089,399 B2
(45) Date of Patent: Sep. 10, 2024

(54) METHOD FOR MANUFACTURING MEMORY AND MEMORY

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 347 days.

(21) Appl. No.: 17/447,433

(22) Filed: Sep. 12, 2021

(65) Prior Publication Data

US 2022/0093606 A1 Mar. 24, 2022

Related U.S. Application Data

(63) Continuation of application No. PCT/CN2021/103375, filed on Jun. 30, 2021.

(30) Foreign Application Priority Data

Sep. 24, 2020 (CN) .......................... 202011016007.4

(51) Int. Cl.
H10B 12/00 (2023.01)
(52) U.S. Cl.
CPC ......... H10B 12/482 (2023.02); H10B 12/315 (2023.02)
(58) Field of Classification Search
CPC .. H10B 12/482; H10B 12/315; H10B 12/053; H10B 12/34
See application file for complete search history.

(56) References Cited

U.S. PATENT DOCUMENTS

| 9,099,343 | B2 | 8/2015 | Kim |
| 10,886,167 | B2 | 1/2021 | Chun et al. |
| 2014/0110816 | A1 | 4/2014 | Kim |
| 2020/0035541 | A1 | 1/2020 | Chun et al. |

(Continued)

FOREIGN PATENT DOCUMENTS

| CN | 103779393 A | 5/2014 |
| CN | 107845633 A | 3/2018 |
| CN | 110767653 A | 2/2020 |

(Continued)

OTHER PUBLICATIONS

CN first office action in application No. 202011016007.4, mailed on May 15, 2024.

*Primary Examiner* — Samuel A Gebremariam
(74) *Attorney, Agent, or Firm* — Syncoda LLC; Feng Ma

(57) ABSTRACT

A method for manufacturing a memory device includes: a substrate is provided, the substrate including active regions; Bit Lines (BLs) are formed over the substrate, the BLs covering part of the active regions; a supporting layer is formed over the substrate covering the BLs and the substrate, first middle holes penetrating through the supporting layer and extending to the active regions are formed on the supporting layer, and gaps are formed between the first middle holes and the BLs; first protective layers are formed in the first middle holes, and etching holes which communicate with the substrate are formed in the first protective layers; the substrate and the active regions exposed in the etching holes are etched along the etching holes to form contact grooves; guide wires electrically connecting the (Continued)

active regions are formed in the first middle holes, the etching holes and the contact groove.

13 Claims, 34 Drawing Sheets

(56) References Cited

U.S. PATENT DOCUMENTS

2020/0203354 A1  6/2020  Lee et al.

FOREIGN PATENT DOCUMENTS

| | | |
|---|---|---|
| CN | 210607254 U | 5/2020 |
| CN | 111354711 A | 6/2020 |
| KR | 100895374 B1 | 4/2009 |
| TW | 200834822 A | 8/2008 |

METHOD FOR MANUFACTURING MEMORY AND MEMORY

CROSS-REFERENCE TO RELATED APPLICATIONS

This is a continuation of International Patent Application No. PCT/CN2021/103375, filed on Jun. 30, 2021, which claims priority to Chinese Patent Application No. 202011016007.4 filed on Sep. 24, 2020. The disclosures of these applications are hereby incorporated by reference in their entirety.

BACKGROUND

A Dynamic Random-Access Memory (DRAM) is widely deployed in various electronic devices because of its higher density and higher reading-writing speed. The dynamic memory generally includes a plurality of memory cells, each of the memory cells generally including a transistor and a capacitor. The capacitor is configured to store data information, and the transistor is configured to control reading and writing of the data information in the capacitor. A gate electrode of the transistor is electrically connected to a Word Line (WL) of the DRAM, and voltage on the WL controlling the transistor to be turned on or turned off. One of a source electrode and a drain electrode of the transistor is electrically connected to a Bit Line (BL) and the other one of the source electrode and the drain electrode is electrically connected to the capacitor, such that the data information is stored or output through the BL.

SUMMARY

The present disclosure relates generally to the technical field of memory devices, and more specifically to a method for manufacturing a memory and a memory.

The embodiments of the disclosure provides a method for manufacturing a memory, which can include the following operations: a substrate is provided, the substrate including active regions; BLs are formed over the substrate, the BLs covering part of the active regions; a supporting layer covering the BLs and the substrate is formed over the substrate, first middle holes penetrating through the supporting layer and extending to the active regions are formed on the supporting layer, and gaps being formed between the first middle holes and the BLs; first protective layers are formed in the first middle holes and etching holes which communicate with the substrate are formed in the first protective layers, part of the active regions being exposed in the etching holes; the substrate and the active regions exposed in the etching holes are etched along the etching holes to form contact grooves; and guide wires electrically connecting the active regions are formed in the first middle holes, the etching holes and the contact grooves.

In the method for manufacturing the memory provided in the embodiments of the present disclosure, the substrate including the active regions is provided, the BLs in contact with part of the active regions and the supporting layer covering the BLs and the substrate are formed over the substrate, and the first middle holes penetrating through the supporting layer and extending to the active regions are formed in the supporting layer. The first protective layers are formed on the side walls of the first middle holes, such that the side walls of the contact grooves are not easy to be etched through while the substrate and the active regions exposed in the etching holes are etched to form the contact grooves along the etching holes communicating with the substrate in the first protective layers; and after the guide wires electrically connecting the active regions are subsequently formed in the first middle holes, the etching holes and the contact grooves, direct communications between the guide wires and the BLs can be avoided, and then the yield of a memory is increased.

The embodiments of the present disclosure further provide a memory, which includes: a substrate, the substrate covering active regions; BLs, the BLs being positioned over the substrate and in contact with the active regions; a supporting layer, the supporting layer covering the BLs and the substrate, the supporting layer being provided with guide wire holes penetrating through the supporting layer, and guide wires extending into the substrate and in contact with the active regions being arranged in the guide wire holes; and first protective layers, the first protective layers being positioned on the inner walls of the guide wire holes and over the substrate.

DETAILED DESCRIPTION

In order to make the objectives, technical solutions, and advantages of the embodiments of the present disclosure clearer, the technical solutions in the embodiments of the present disclosure will be described clearly and completely in combination with the drawings in the embodiments of the present disclosure. It is apparent that the described embodiments are part of, but not all of, the embodiments of the present disclosure. Based on the embodiments in the present disclosure, all other embodiments obtained by those of ordinary skill in the art without creative efforts shall fall within the protection scope of the present disclosure.

Typically, a DRAM includes a substrate, which includes active regions thereon, BLs arranged at intervals and a supporting layer covering the BLs being arranged over the substrate. The BLs are electrically connected to the active regions, a contact hole, in which a guide wire is filled, is formed in the supporting layer, the guide wire being configured to electrically connect the capacitor to the active regions. To increase the contact area between the guide wire and the active regions, contact grooves are generally formed on a surface of the substrate in the contact hole. However, in a process of manufacturing the DRAM, transistor failure caused by communication between the BLs and the guide wire is liable to occur, leading to a low yield of the DRAM.

Various embodiments of the present disclosure provide a method for manufacturing a memory, which can include: BLs, and a supporting layer covering the BLs and a substrate are formed over the substrate, first middle holes are formed in the supporting layer, first protective layers are arranged in the first middle holes; while the substrate is etched along etching holes in first protective layers to form contact grooves, the side walls of the contact grooves are not easy to be etched through in comparison with a mode of directly etching the substrate along the first middle holes; and after guide wires are formed in the first middle holes, the etching holes and the contact grooves subsequently, the guide wires can be prevented from being in direct communication with the BLs, such that the yield of a memory is increased.

Embodiment 1

Figure 1:
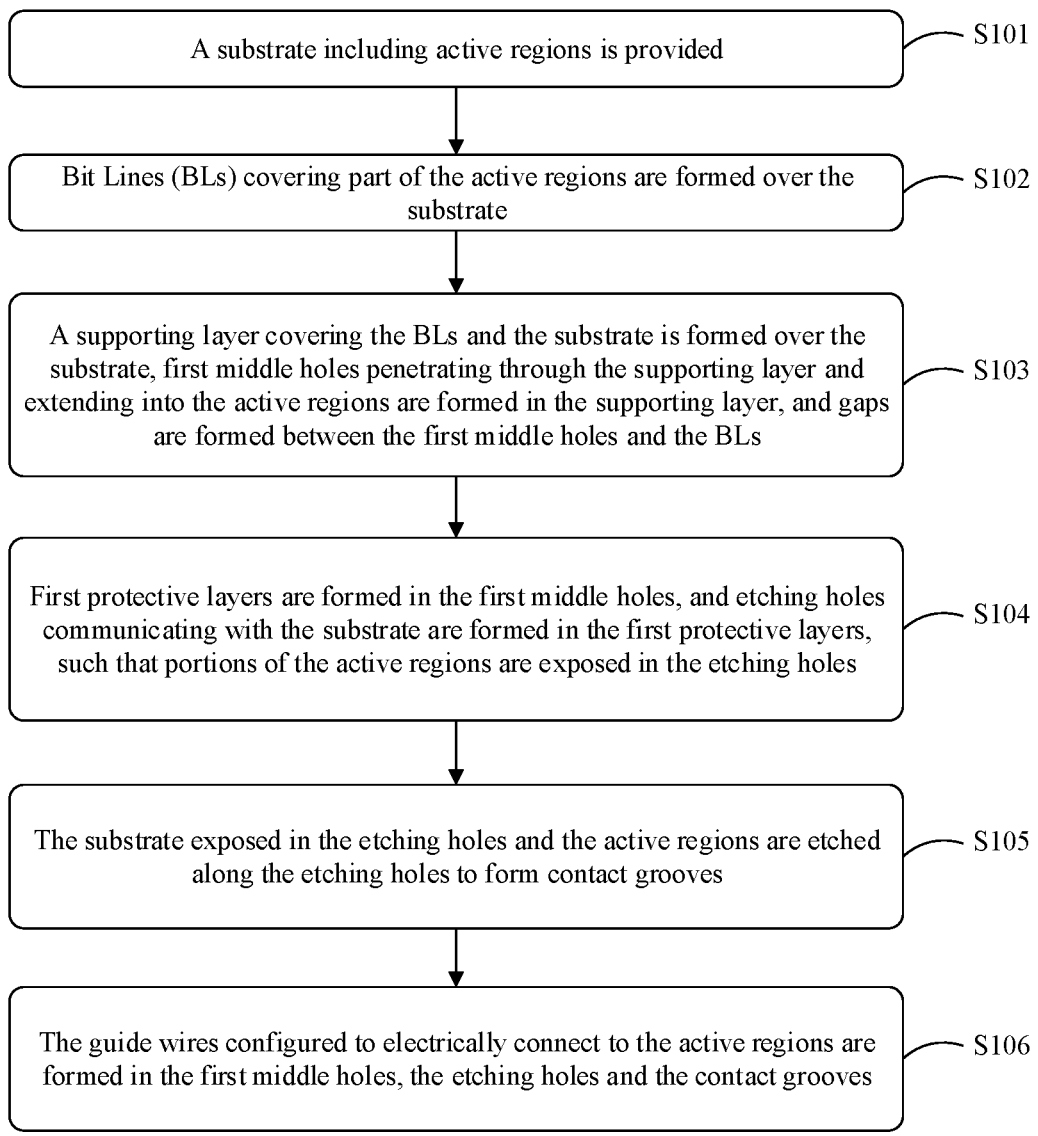
FIG. 1 is flowchart showing a method for manufacturing a memory provided in an embodiment of the present disclosure.

FIG. 1 is a flowchart showing a method for manufacturing a memory provided in an embodiment of the present disclosure; FIG. 2 to FIG. 33 are structural schematic diagrams of a memory in an embodiment of the present disclosure at each stage, and structural schematic diagrams of a memory. A method for manufacturing a memory provided in an embodiment of the present disclosure will be described in detail in combination with FIG. 1 to FIG. 33.

A method for manufacturing a memory provided in an embodiment of the present disclosure includes the following steps.

At S101, a substrate including active regions is provided.

Figure 2:
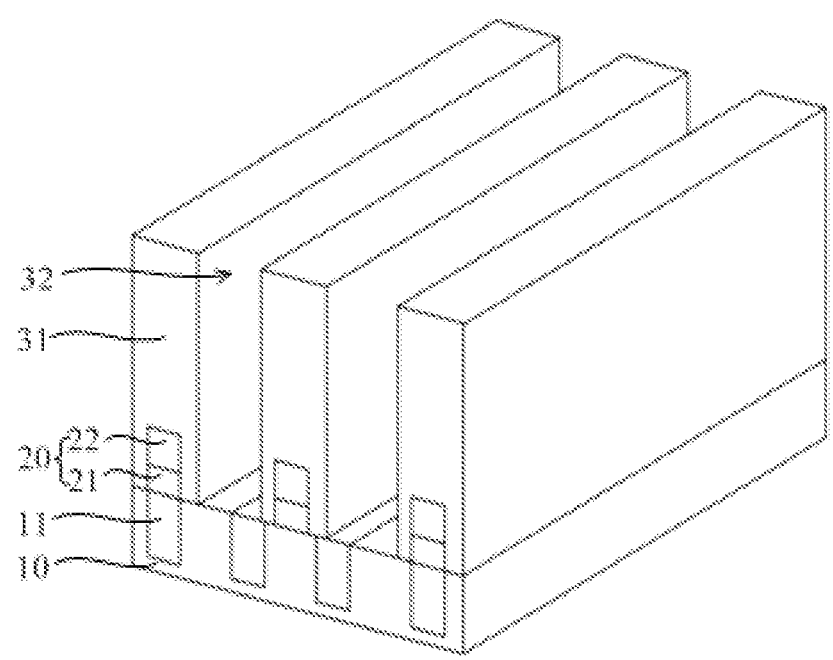
FIG. 2 is a structural schematic diagram after a first supporting pad is formed in an embodiment of the present disclosure.
Figure 3:
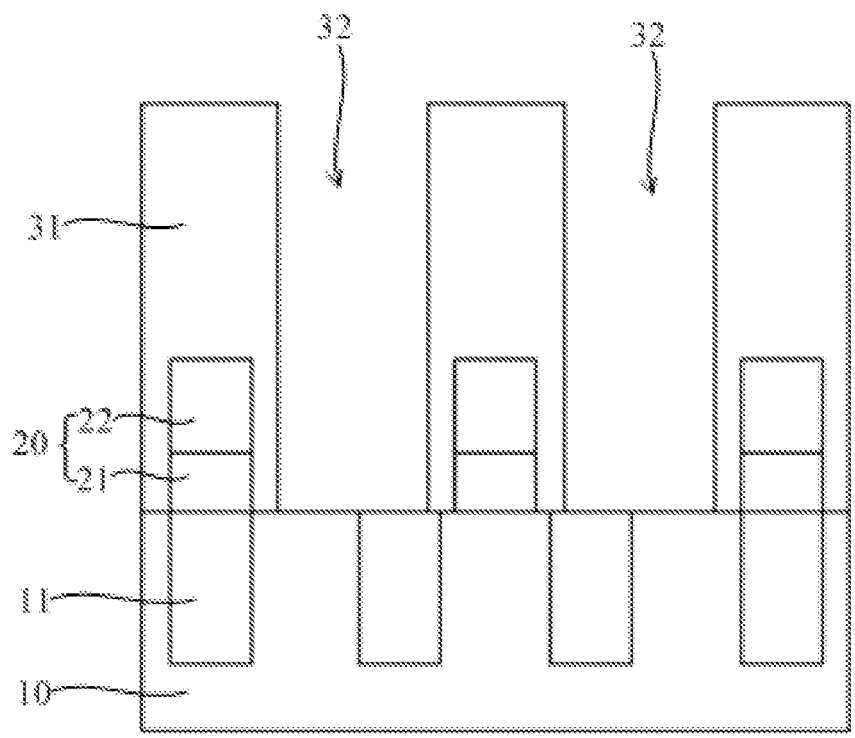
FIG. 3 is a front view of FIG. 2.
Figure 4:
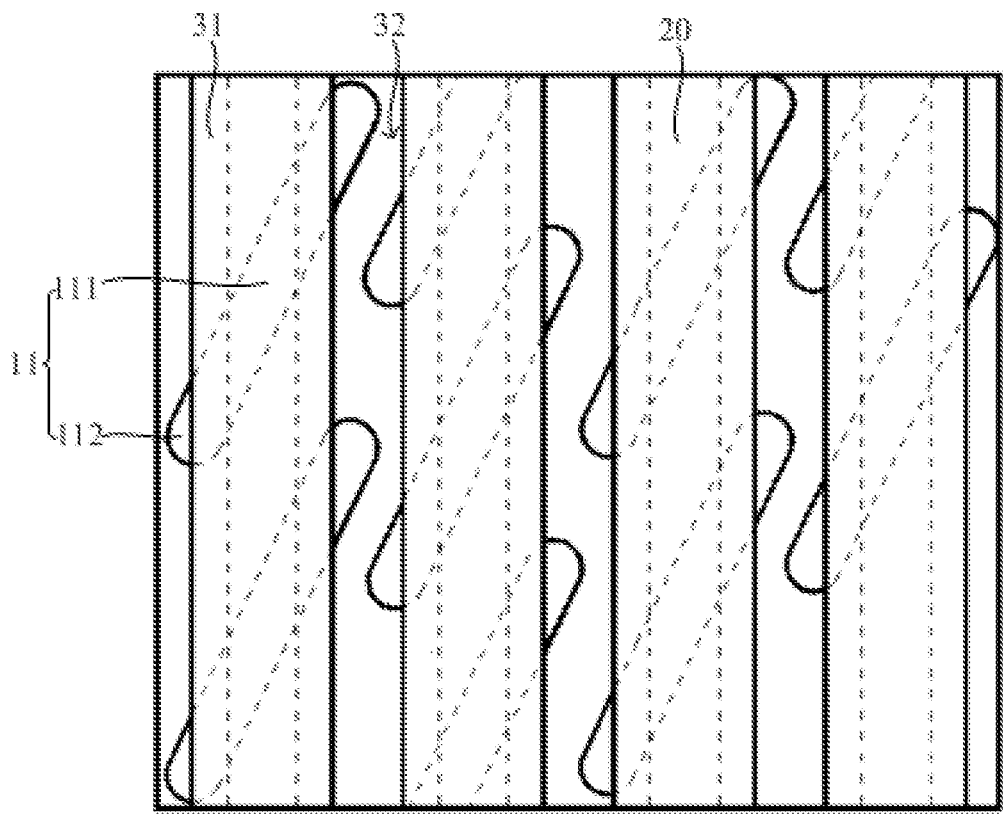
FIG. 4 is a top view of FIG. 2.

Referring to FIG. 2 to FIG. 4, the active regions 11 including a first contact region 111 and a second contact region 112 are arranged over the substrate 10, the first contact region 111 being positioned in middle areas of the active regions 11 and being configured to electrically connect to BLs 20. The second contact region 112 can be positioned on the two end parts of the active regions 11, and configured to electrically connect to a capacitor in a memory cell, for example, the second contact region 112 being electrically connected to the capacitor through guide wires 70.

The active regions 11 can form a transistor in a memory cell, illustratively, the first contact region 111 is a source region and the second contact region 112 is a drain region, the source region and the drain region being formed through an ion injection process. The material of the substrate 10 can be silicon oxide, the material of the active region 11 can be a semiconductor material, for example, a silicon material.

A plurality of active regions 11 can be arranged to increase a utilization rate of the substrate 10 and improve density of the memory cell. A certain gap can be formed between the plurality of the active regions 11, i.e., the active regions 11 do not communicate with one another. The plurality of the active regions 11 can be arranged in parallel, and shallow slots can be formed in the active regions 11 for isolating.

At S102, the BLs covering part of the active regions are formed over the substrate.

Continuously referring to FIG. 2 to FIG. 4, the BLs 20 over the substrate 10 are electrically connected to part of the active regions 11. The BLs 20 can be made of a conductive material, for example one or more of tungsten, titanium, nickel, aluminum, titanium oxide and titanium nitride. The conductive material is deposited on part of the substrate 10 and part of the active regions 11 to form the BLs 20. Specifically, the BLs 20 cover the first contact region 111 of the active regions 11.

In the embodiment of the present disclosure, each of the BLs 20 includes a first sub body 21 close to the substrate 10 and a second sub body 22 in contact with the first sub body 21. The first sub body 21 is in contact with the substrate 10 and the active regions 11, and the material of the first sub body 21 can be titanium nitride (TiN). The second sub body 22 is positioned at one side, away from the substrate 10, of the first sub body 21, and the material of the second sub body 22 can be tungsten (W).

When the substrate 10 includes a plurality of active regions 11, a plurality of BLs 20 can be arranged over the substrate 10, the plurality of the it lines being arranged at intervals. Positive projections, over the substrate 10, of the BLs 20 and positive projections, over the substrate 10, of the active regions 11 have certain angle, i.e., the two positive projections are not parallel to each other.

Illustratively, in a direction as shown in FIG. 4, the BLs 20 are vertically arranged, and are parallel to each other. The plurality of the active regions 11 are arranged in an inclined mode, and are parallel to one another. One BL 20 is arranged on each of the active regions 11, and the same BL 20 can pass through the plurality of the active regions 11.

At S103, a supporting layer covering the BLs and the substrate is formed over the substrate, first middle holes penetrating through the supporting layer and extending into the active regions are formed in the supporting layer, and gaps are formed between the first middle holes and the BLs.

Taking the plane parallel to the substrate 10 as the section, the sections of the first middle holes 36 can be in the form of a polygon which can be a regular polygon such as a square and a regular pentagon. The embodiment and the following embodiments are described in detail by taking the first middle holes 36 with rectangular sections as an example.

The material of the supporting layer 30 can be an insulating material, for example silicon nitride for protecting and electrically isolating the BLs 20. Taking a direction as shown in FIG. 2 as an example, the first middle holes 36 are vertical holes, extend to the substrate 10, and communicate with part of the active regions 11. Specifically, the first middle holes 36 communicate with a second contact region 112 of the active regions 11.

When a plurality of BLs 20 are arranged, the supporting layer 30 and the first middle holes 36 can be formed through the following steps.

First supporting pads 31 respectively covering the BLs 20 are formed over the substrate 10.

Referring to FIG. 2 to FIG. 4, a plurality of active regions 11 are arranged in the substrate 10, and a plurality of BLs 20 are arranged over the substrate 10. One bit line 20 is in contact with several active regions 11 among the plurality of the active regions 11, and is in contact with the first contact region 111 of each of the active regions 11.

First supporting pads 31 respectively cover each of the BLs 20, and the number of the first supporting pads 31 being consistent with the number of the BLs 20. The first supporting pads 31 are arranged at intervals, and as shown in FIG. 4, gaps 32 are formed between the first supporting pads 31. The first supporting pads 31 are made of an insulating material, for example silicon nitride.

Figure 5:
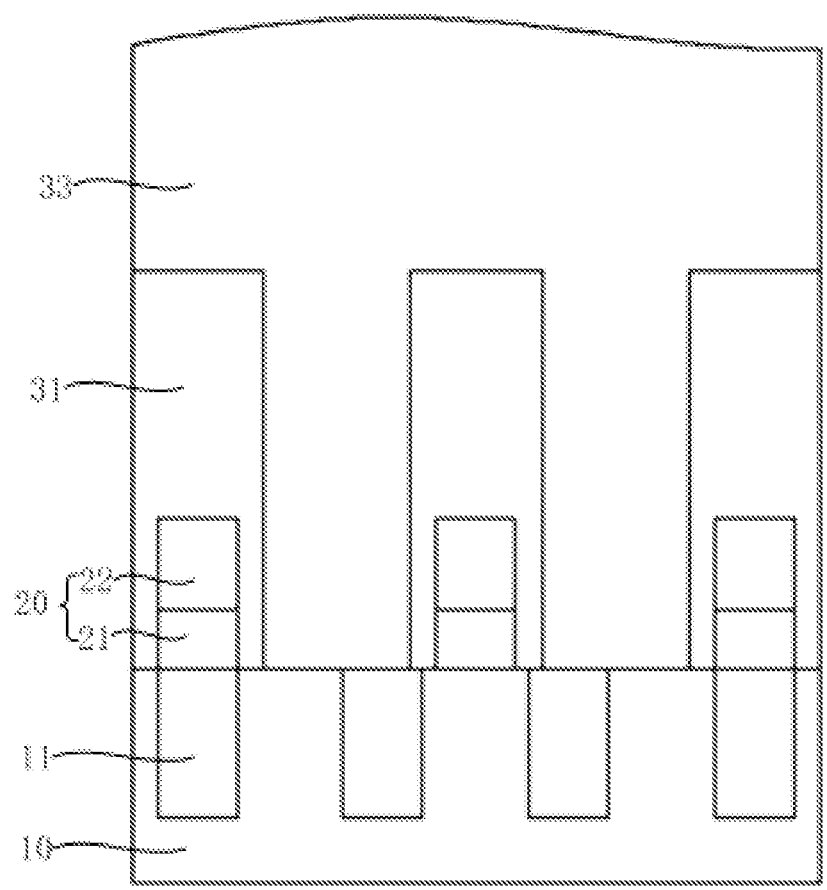
FIG. 5 is a structural schematic diagram after a sacrificial layer is formed in an embodiment of the present disclosure.

After the first supporting pads 31 respectively covering the BLs 20 are formed over the substrate 10, a sacrificial layer 33 is formed to fill up the gaps 32 between the first supporting pads to form a structure as shown in FIG. 5.

That is, the sacrificial layer 33 covering the substrate 10 and the first supporting pads 31 is formed. The sacrificial layer 33 can be formed through a Spin on Dielectrics (SOD) process, for example, the sacrificial layer 33 is formed by SOD silicon oxide. After being formed through the SOD, the sacrificial layer 33 is annealed, cured and compacted for follow-up processing.

Illustratively, the material of the sacrificial layer 33 can be silicon oxide. The silicon oxide material has a higher selection ratio, is easily etched, and can reduce the height of a mask.

Figure 6:
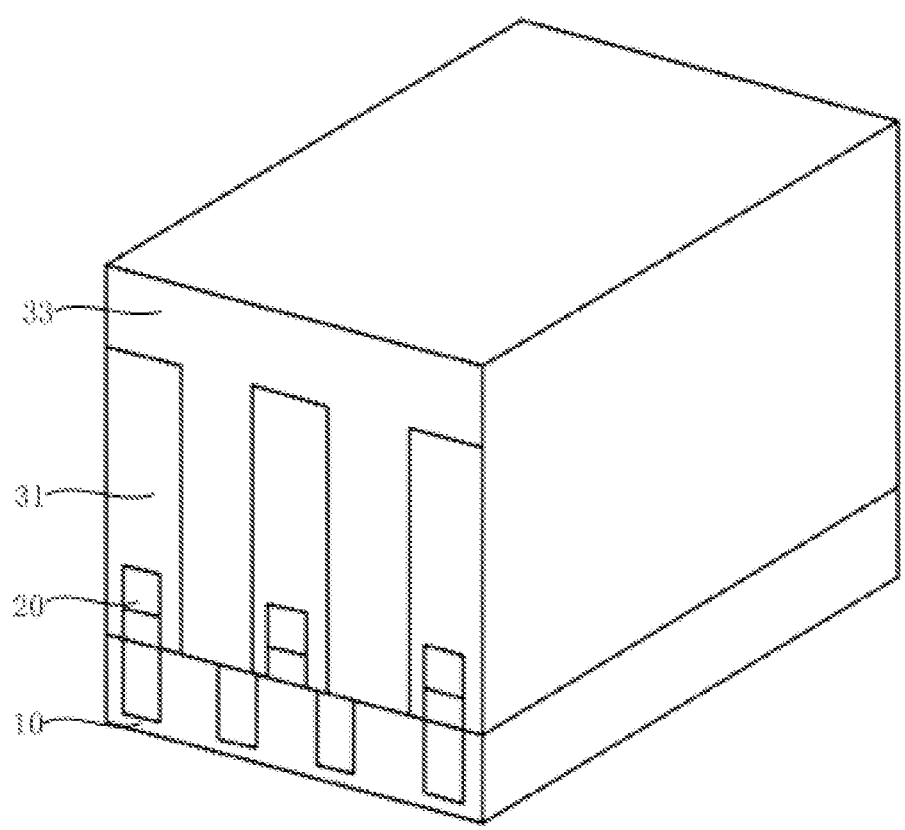
FIG. 6 is a structural schematic diagram after a sacrificial layer is flattened in an embodiment of the present disclosure.
Figure 7:
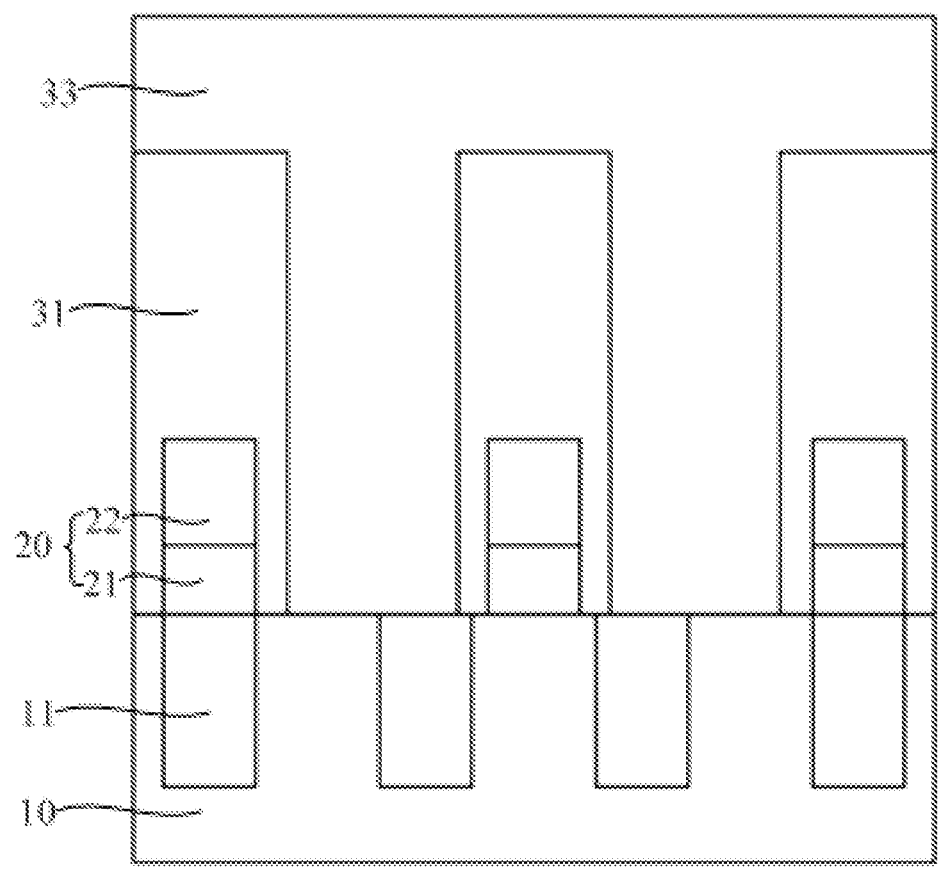
FIG. 7 is a front view of FIG. 6.
Figure 8:
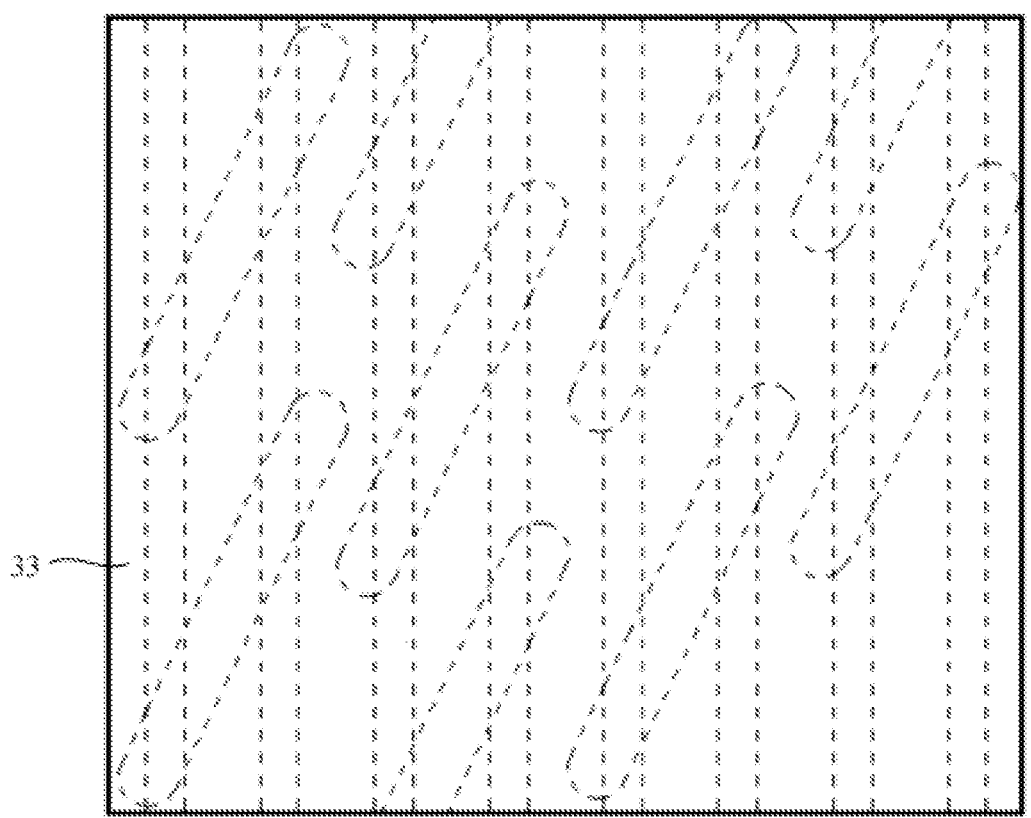
FIG. 8 is a top view of FIG. 6.

It should be noted that after the sacrificial layer 33 is formed, the surface of the sacrificial layer 33 can be flattened prior to the following operation. As shown in FIG. 6 to FIG. 8, the surface, away from the substrate 10, of the sacrificial layer 33 is flattened.

After being flattened, the upper surface of the sacrificial layer 33 is flat, such that other needed layers are conveniently arranged on the sacrificial layer 33. The surface, away from the substrate 10, of the sacrificial layer 33 can be processed through Chemical Mechanical Polishing (CMP). It is certain that the sacrificial layer 33 also can be flattened through methods such as ion etching, which is not limited in the embodiment of the present disclosure.

Figure 11:
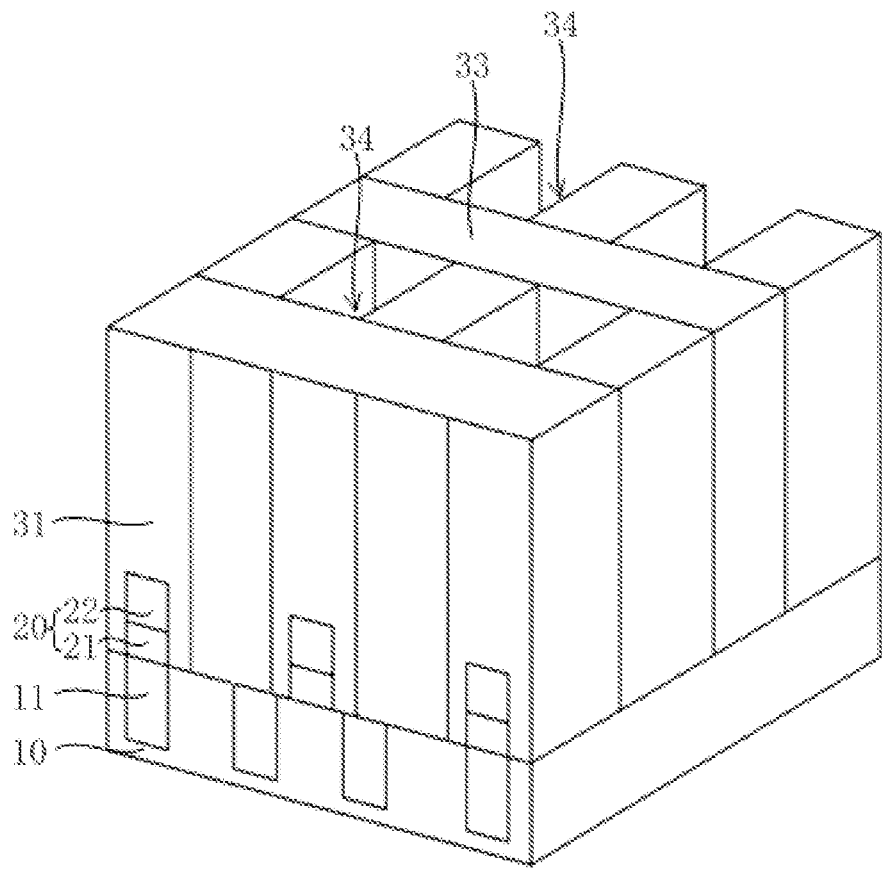
FIG. 11 is a structural schematic diagram after first filling hole are formed in an embodiment of the present disclosure.

After the sacrificial layer 33 is formed to fill up the gap 32 between the first supporting pads, first filling holes 34 are formed in the sacrificial layer 33 to form a structure as shown in FIG. 11.

In a possible example, the first filling holes 34 are formed by etching. Specifically, a mask layer 40 is formed on the sacrificial layer 33, then, the sacrificial layer 33 is etched by the mask layer 40 to form the first filling holes 34 extending to the substrate 10, and finally, the mask layer 40 is removed.

Figure 9:
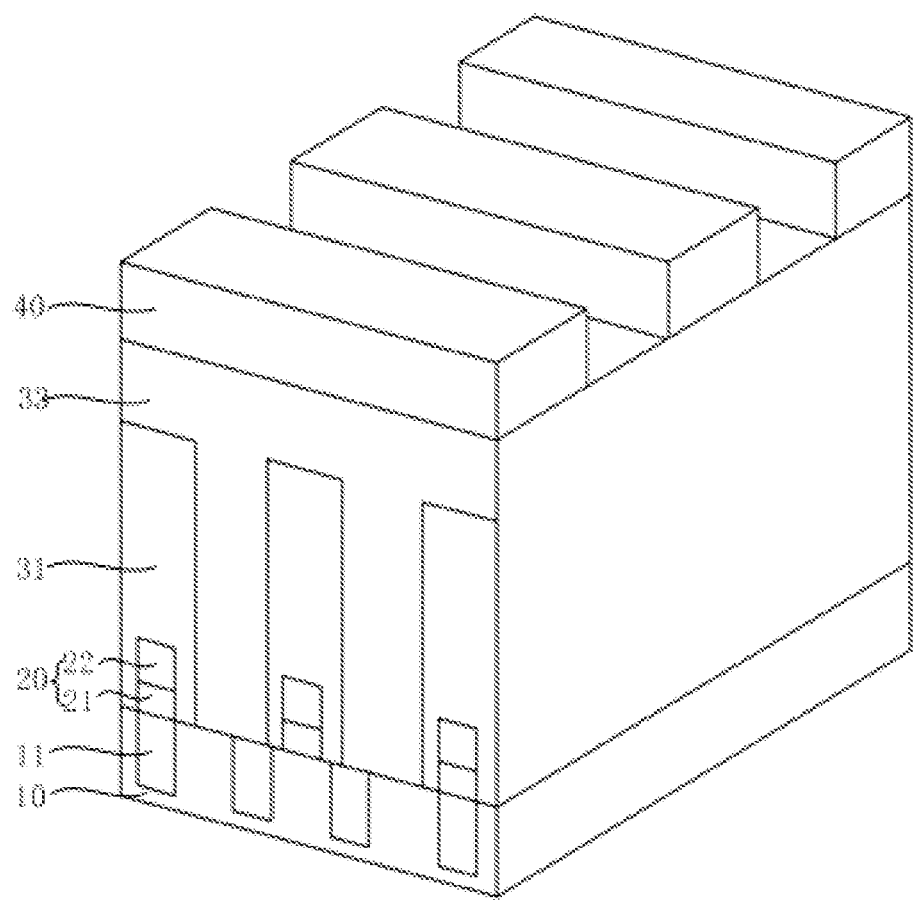
FIG. 9 is a structural schematic diagram after a mask layer is formed in an embodiment of the present disclosure.
Figure 10:
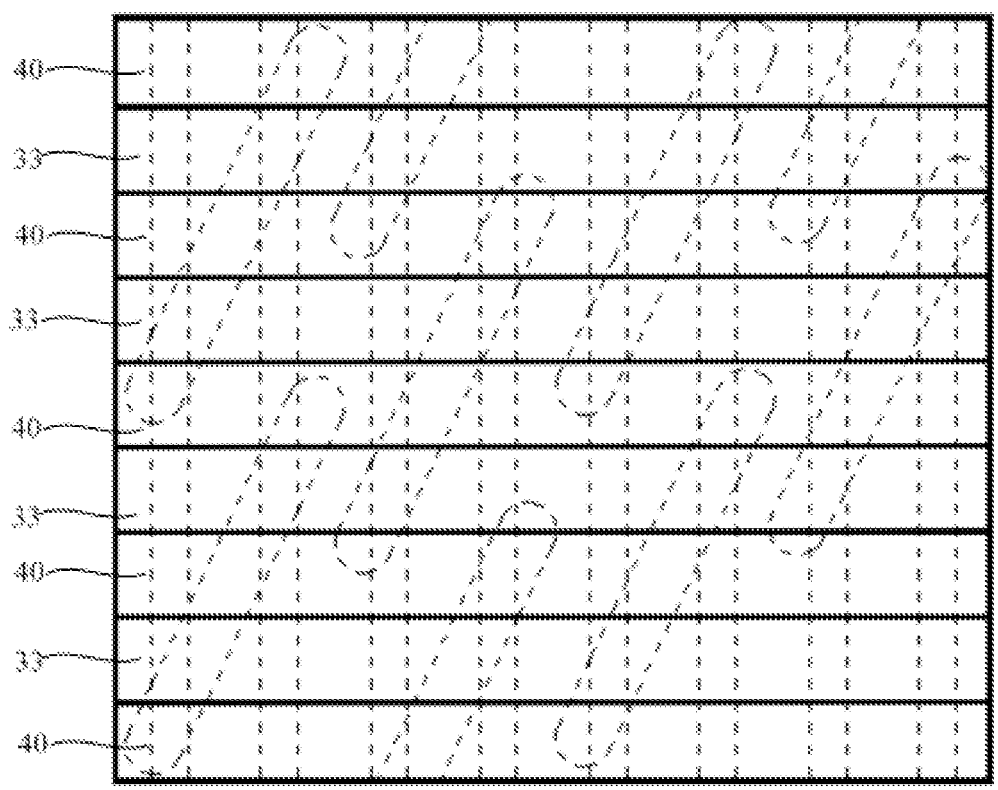
FIG. 10 is a top view of FIG. 9.

Illustratively, the mask layer 40 can be formed on the upper surface of the sacrificial layer 33 through deposition. The mask layer 40 has a certain pattern. As shown in FIG. 9 and FIG. 10, the mask layer 40 is provided with a plurality of grooves parallel to one another, and the plurality of the grooves are mutually perpendicular to the positive projections, on the surface of the substrate 10, of the first supporting pads 31. The grooves form etching windows, along which the sacrificial layer 33 is etched. The material of the mask layer 40 can be Photo Resist (PR).

Figure 12:
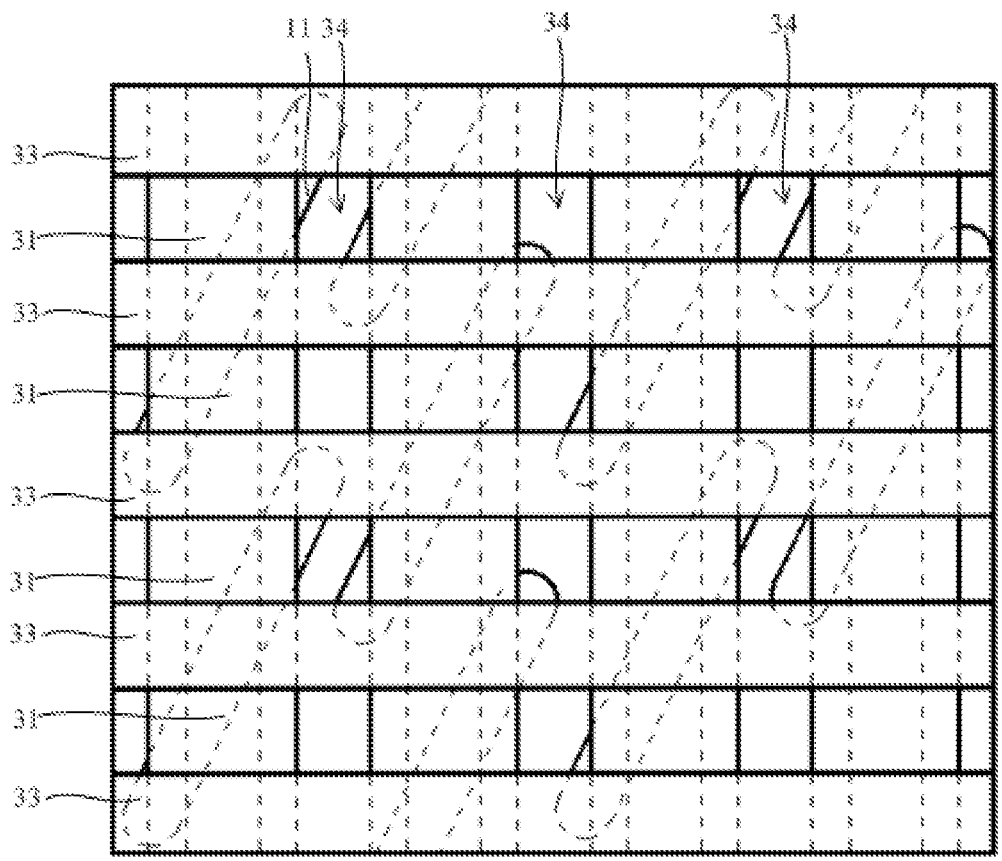
FIG. 12 is a top view of FIG. 11.

It should be noted that in an etching process, part of the sacrificial layer 33 is removed. The sacrificial layer 33 is etched with an etching solution or etching gas. The first supporting pads 31 are not etched. The first filling holes 34 as shown in FIG. 11 and FIG. 12 are formed. The first filling holes 34 penetrates through the sacrificial layer 33, and are in contact with the substrate 10.

Figure 13:
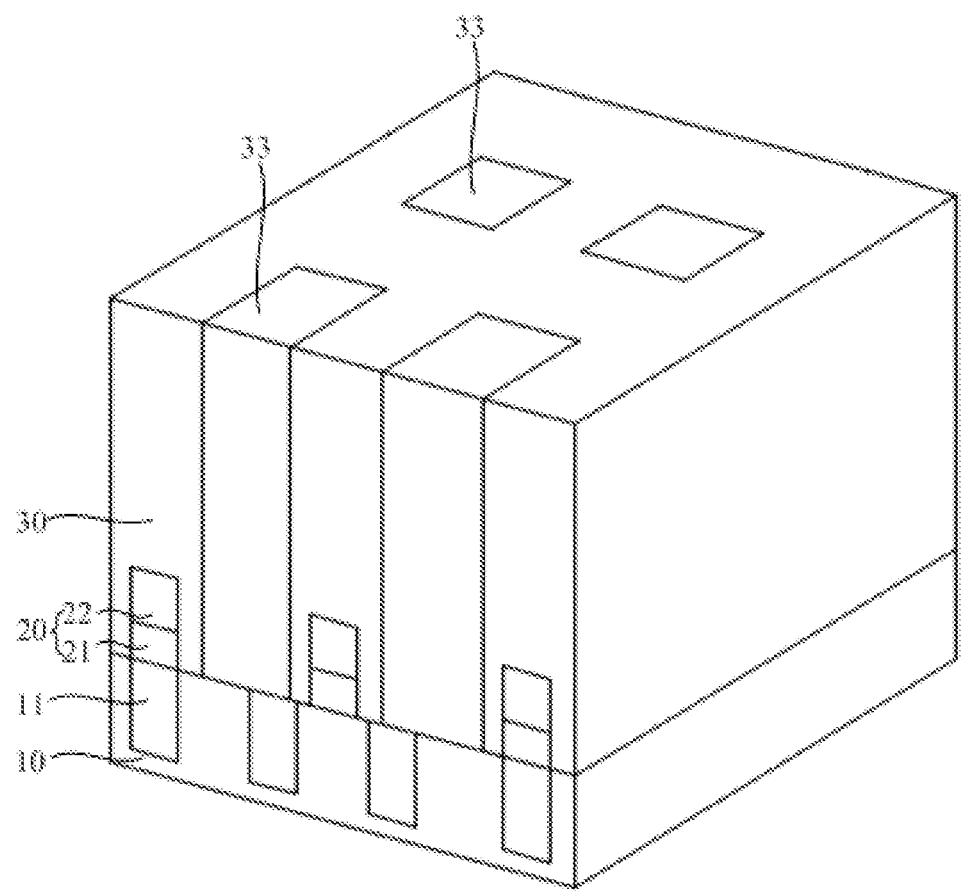
FIG. 13 is a structural schematic diagram after a second supporting pad is formed in an embodiment of the present disclosure.
Figure 14:
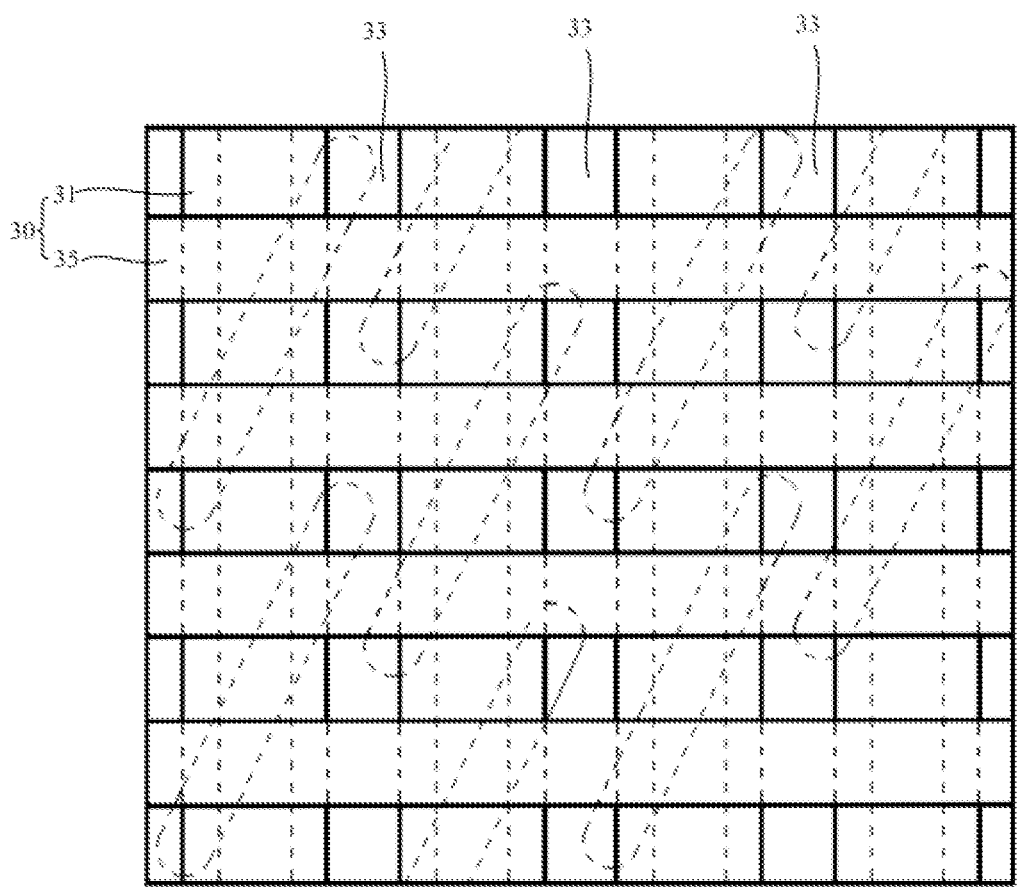
FIG. 14 is a top view of FIG. 13.

After the first filling holes 34 are formed in the sacrificial layer 33, second supporting pads 35 are formed in the first filling holes 34. The second supporting pads 35 and the first supporting pads 34 have the same height, and together constitute a supporting layer 30 to form a structure as shown in FIG. 13 and FIG. 14.

The material of the second supporting pads 35 can be the same as that of the first supporting pads 31, and the second supporting pads 35 is filled up in the first filling holes 34. As shown in FIG. 14, positive projections, on the surface of the substrate 10, of the first supporting pads 31 and the second supporting pads 35 can be perpendicular to each other, i.e., the first supporting pads 31 can be arranged in a vertical direction as shown in FIG. 14, and the second supporting pads 35 can be arranged in a horizontal direction as shown in FIG. 14.

The second supporting pad 35 and the first supporting pads 34 have the same height, and together constitute a supporting layer 30. Illustratively, the upper surface of the second supporting pad 35 can be polished through CMP, such that the second supporting pad 35 and the first supporting pads 31 are consistent in height.

It should be understood that during CMP, each part except from the upper surfaces of the first supporting pads 31 can be removed, i.e., part of the second supporting pad 35 and part of the sacrificial layer 33 are ground and removed until the upper surfaces of the first supporting pads 31 are exposed; or part of the surface layers of the first supporting pads 31 and each part outside the surface layer can be removed, i.e., part of the first supporting pads 31, part of the second supporting pad 35 and part of the sacrificial layer 33 are ground and removed.

Figure 15:
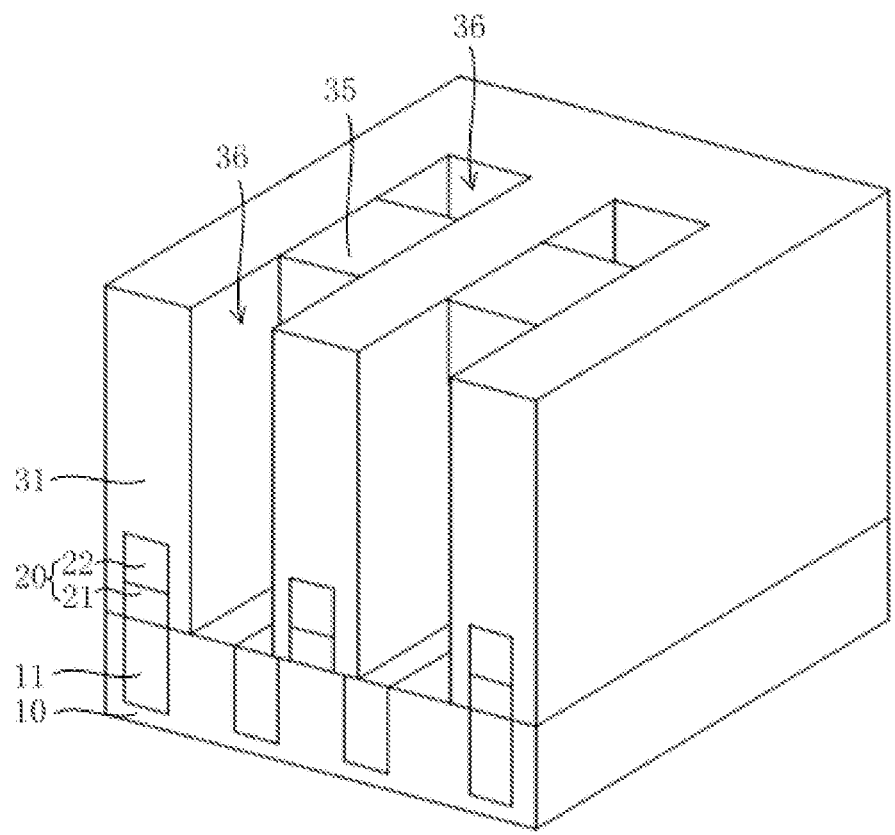
FIG. 15 is a structural schematic diagram after first middle holes are formed in an embodiment of the present disclosure.
Figure 16:
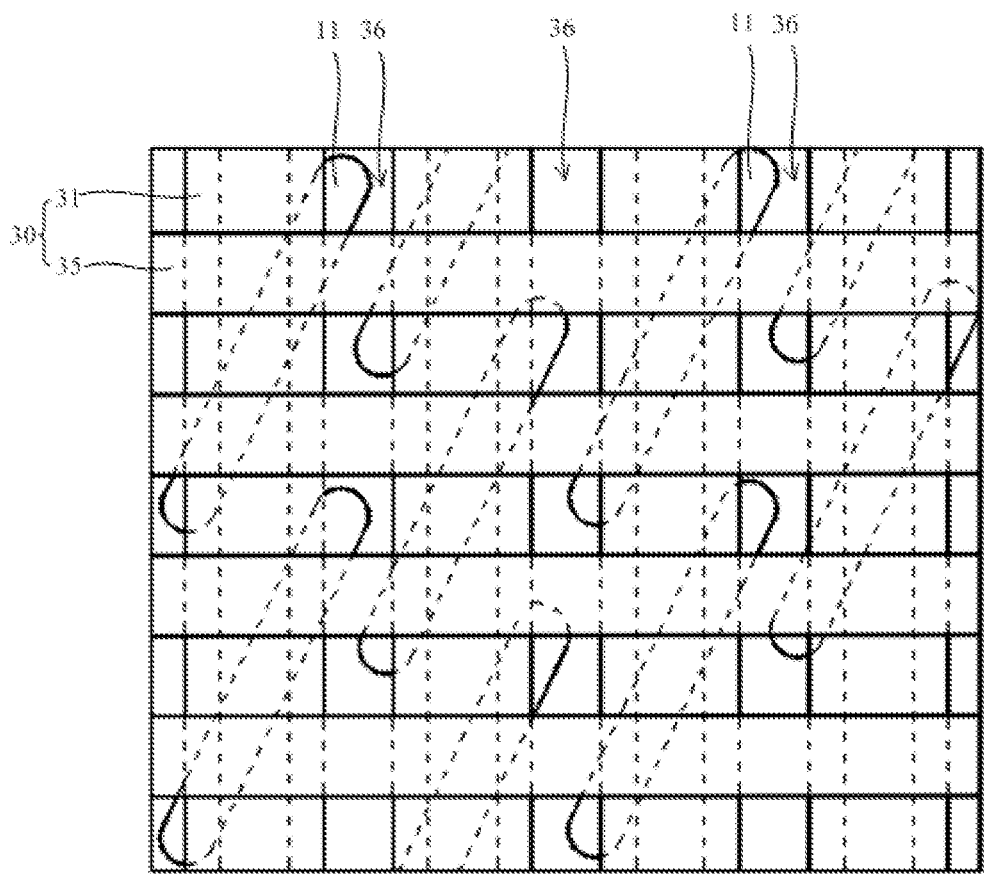
FIG. 16 is a top view of FIG. 15.

The second supporting pads 35 are formed in the first filling holes 34, and the second supporting pads 35 and the first supporting pads 34 have the same height. After the supporting layer 30 is formed, the sacrificial layer 33 is removed to form first middle holes 36 in the supporting layer 30 to form a structure as shown in FIG. 15 and FIG. 16.

Specifically, the residual sacrificial layer 33 between gaps 32 of the first supporting pads 31 is removed until the sacrificial layer 33 is completely removed.

It should be understood that the first middle holes 36 penetrate through the supporting layer 30 and extend to the substrate 10 and the active regions 11. Specifically, as shown in FIG. 16, part of the substrate 10 and the second contact region 112 of the active regions 11 are exposed in the first middle holes 36 for filling up guide wires 70 subsequently. A plurality of first middle holes 36 are formed, and the dimensions of the plurality of the first middle holes 36 can be consistent with the shapes thereof.

At S104, first protective layers are formed in the first middle holes, and etching holes communicating with the substrate are formed in the first protective layers, such that portions of the active regions are exposed in the etching holes.

Specifically, the first protective layers 80 are arranged on the inner walls of the first middle holes 36 and are in contact with the substrate 10. Etching holes 51 are formed in the first protective layers 80 for protecting the first middle holes 36, especially, the parts, close to the substrate 10, of the first middle holes 36.

When the contact grooves 12 are etched over the substrate 10 through the etching holes 51 in the first protective layers, on one hand, the first protective layers 80 can reduce etching influences on the side walls of the first middle holes 36 during etching. On the other hand, the etching holes 51 are in the first protective layers 80, and the plane parallel to the surface of the substrate 10 is taken as a section. The section area of the etching holes 51 is smaller than the section area of the first middle holes 36. A certain margin is provided during etching, such that the contact grooves 12 and/or the side walls of the first middle holes 36 are prevented from being etched. In such a manner, the BLs 20 and/or the BLs 20 are in contact to expose.

It should be noted that the first protective layers 80 can be arranged by a circle in a peripheral direction of the first middle holes 36, also can be discontinuous in the peripheral direction of the first middle holes 36. Illustratively, each first protective layer 80 includes a plurality of protective blocks, the plurality of the protective blocks being arranged at intervals in the peripheral direction of the first middle holes 36, and each of the protective blocks being in contact with the substrate 10.

The process of forming the first protective layers 80 in the first middle holes 36 is described in detail below.

Figure 17:
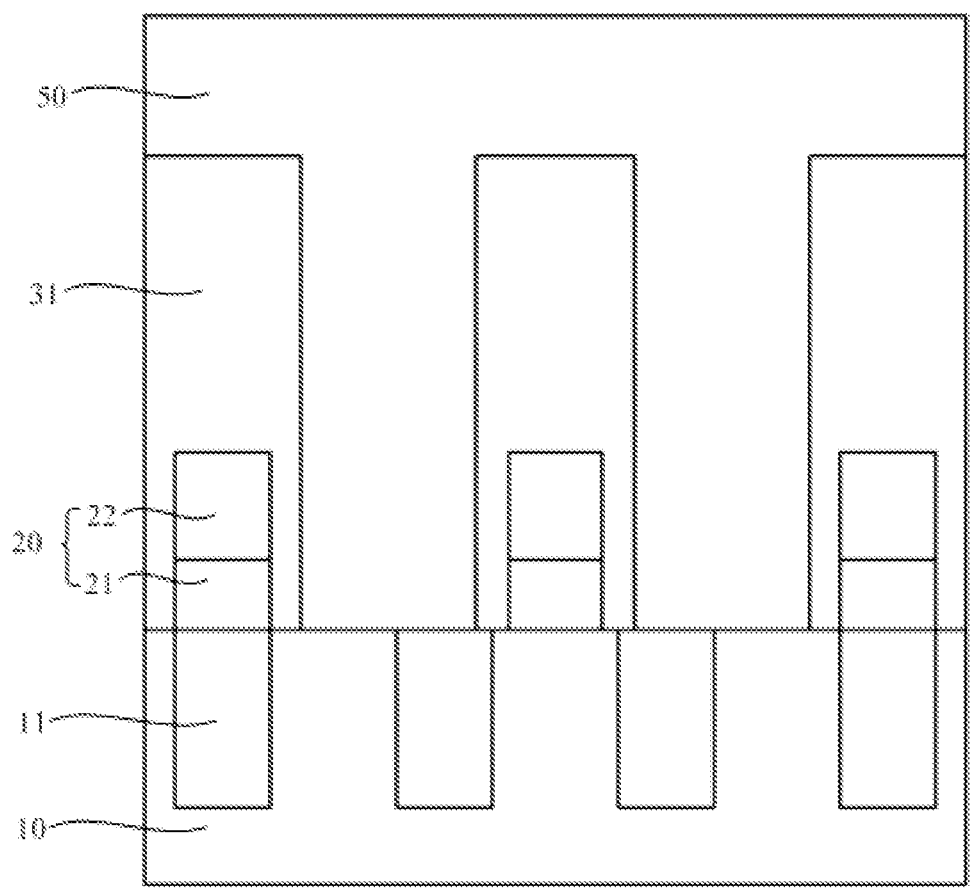
FIG. 17 is a structural schematic diagram after first filling layers are formed in an embodiment of the present disclosure.

First filling layers 50 are formed in the first middle holes 36 and the surface of the supporting layer 30 to form a structure as shown in FIG. 17. Specifically, the first filling layers 50 covering the first middle holes 36 and the supporting layer 30 are formed through Atomic Layer Deposition (ALD). In the atomic layer deposition process, gas can be di(isopropylamino)silane LT0520/02 bi(diethylmino)silane zero/02. The height of the first filling layers 50 is not greater than that of the supporting layer 30, and the material of the first filling layers 50 can be silicon oxide.

Then, part of the first filling layers 50 on the surface of the supporting layer 30 or in the first middle holes 36 are removed to form the first protective layers 80. Specifically, the process includes the following operations.

Referring to FIG. 18 to FIG. 21, part of the first filling layers 50 in the first middle holes 36 are removed to expose the side walls of part of the first middle holes 36.

Figure 18:
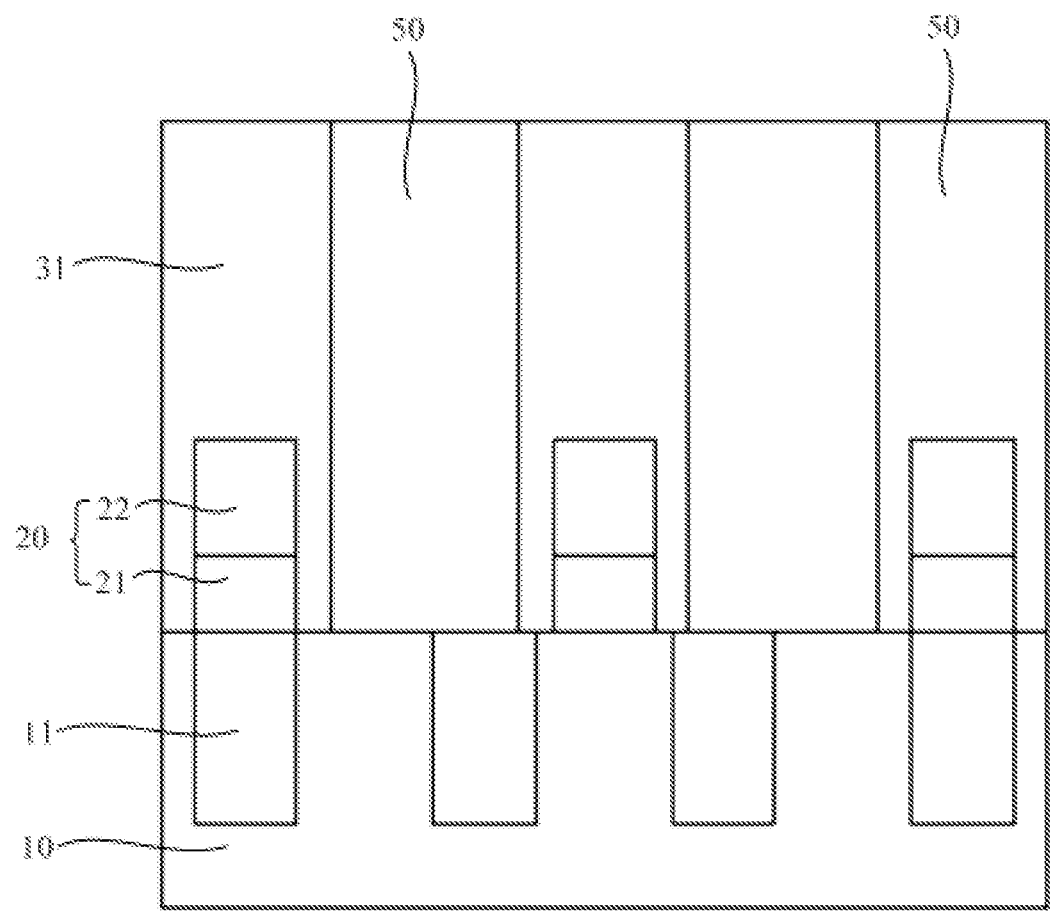
FIG. 18 is a structural schematic diagram after first filling layers on a supporting layer are removed in an embodiment of the present disclosure.

Illustratively, the first filling layers 50 on the surface of the supporting layer 30 can be removed by CMP until the surface of the supporting layer 30 is grounded to be exposed, i.e., the first filling layers 50 above the upper surface of the supporting layer 30 are removed to form a structure as shown in FIG. 18.

Figure 19:
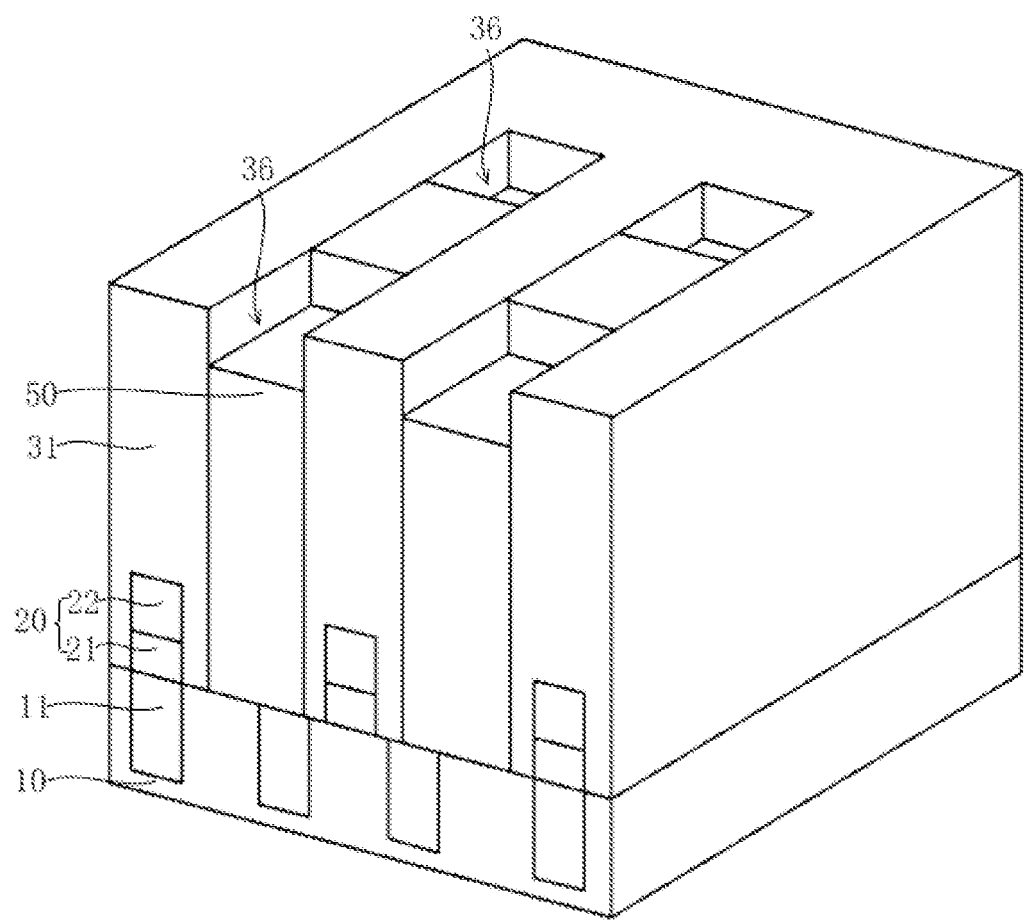
FIG. 19 is a structural schematic diagram after part of first middle holes are exposed in an embodiment of the present disclosure.
Figure 20:
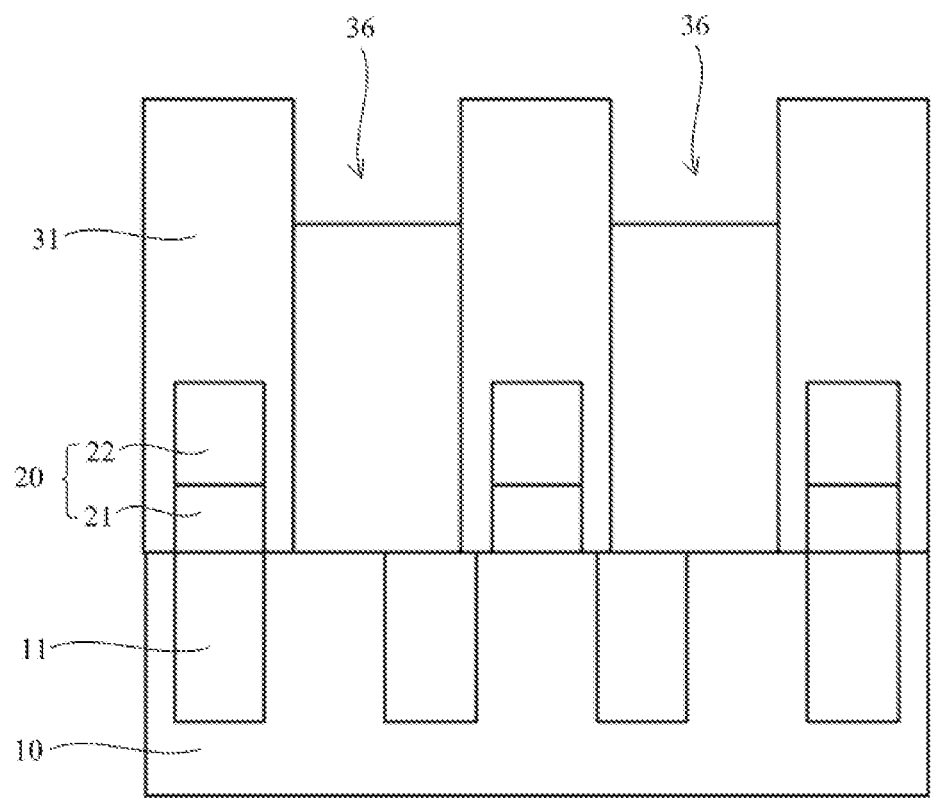
FIG. 20 is a front view of FIG. 19.
Figure 21:
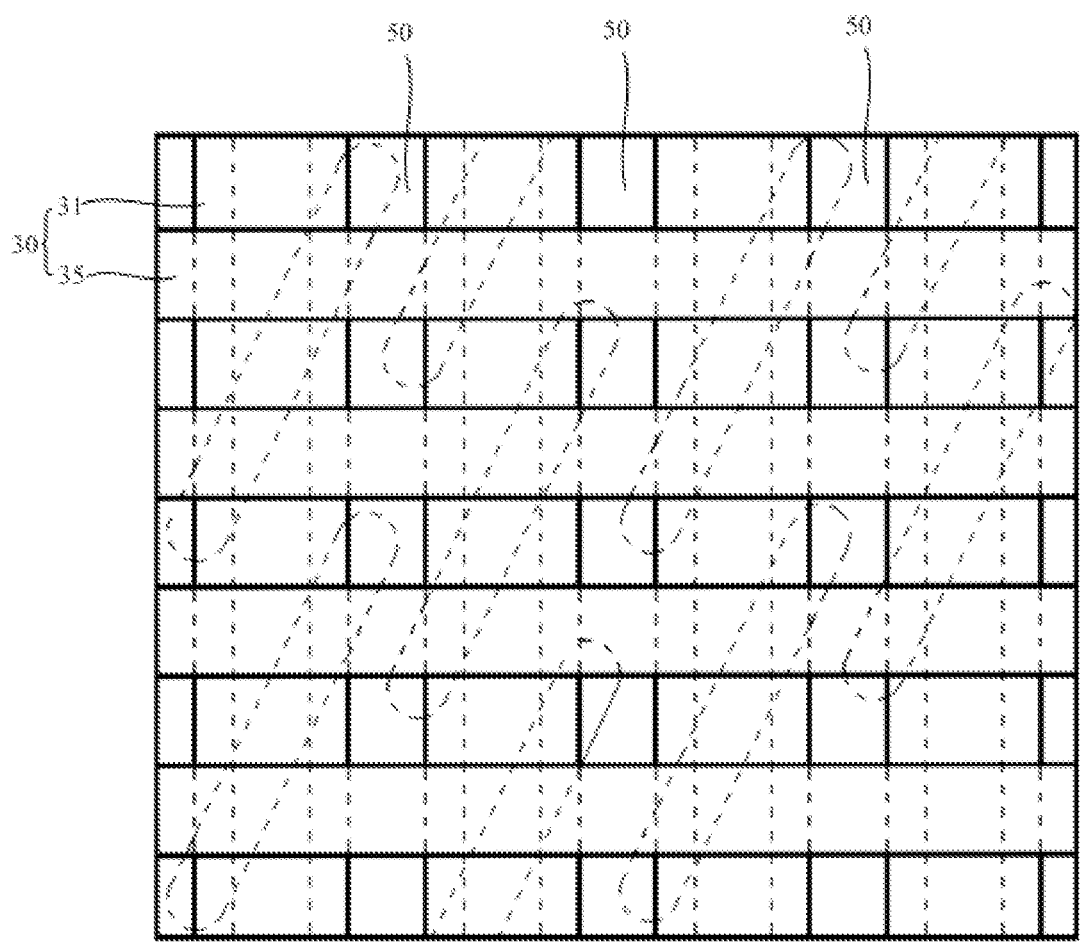
FIG. 21 is a top view of FIG. 19.

Illustratively, part of the first filling layers 50 in the first middle holes 36 are removed by etching to form a structure as shown in FIG. 19 to FIG. 21; the height of the removed first filling layers 50 is ⅕ to ¼ of the height of the whole side wall of each first middle hole 36, i.e., the height of the exposed side walls of the first middle holes 36 is ⅕ to ¼ of the height of the whole side walls of the first middle holes 36.

Figure 22:
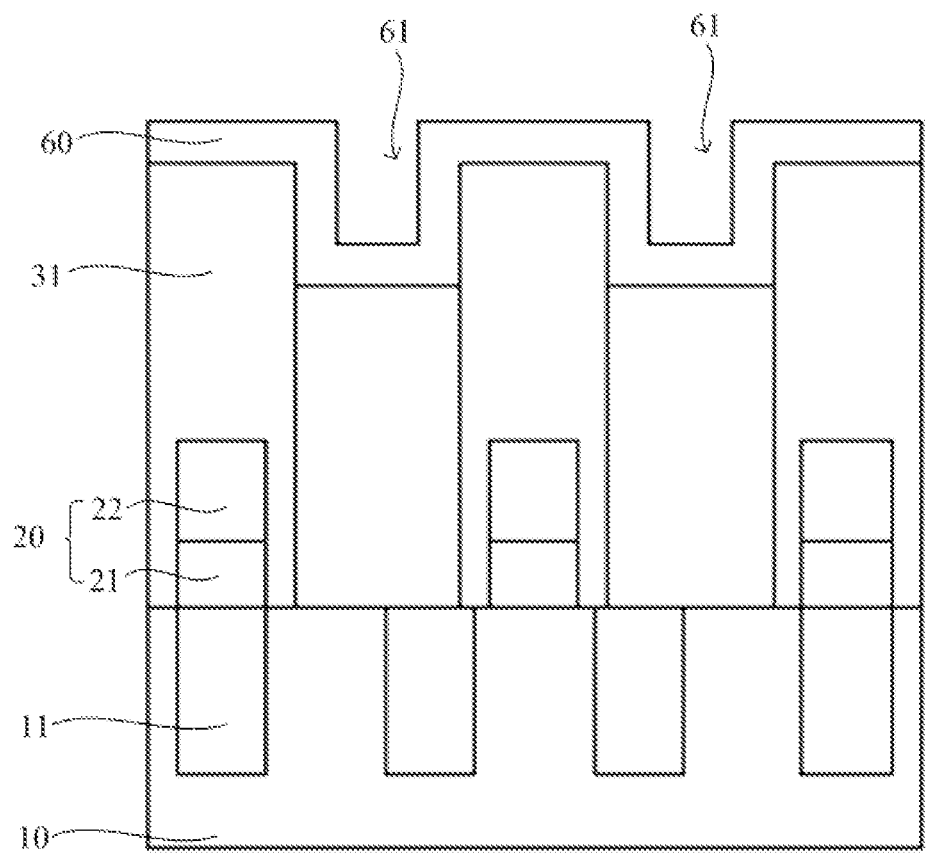
FIG. 22 is a structural schematic diagram after second filling layers are formed in an embodiment of the present disclosure.

Referring to FIG. 22, part of the first filling layers 50 in the first middle holes 36 are removed, such that second filling layers 60 are formed in the first middle holes 36 after part of side walls of the first middle holes 36 are exposed, the second filling layers 60 covering the exposed side walls of the first middle holes 36 and the tops of the remaining first filling layers 50. Second middle holes 61 are formed in the second filling layers 60.

Specifically, referring to FIG. 22, the second filling layers 60 are formed on the side walls of the first middle holes 36, the upper surfaces of the first filling layers 50 and the upper surfaces of the supporting layers 30. The second filling layers 60 can be formed through deposition, and the material of the second filling layers 60 can be the same with that of the first filling layers 50, which is for example a silicon oxide material.

Second middle holes 61 are formed in the second filling layers 60 in the first middle holes 36, i.e., the surface parallel to the substrate 10 is a plane, and the section area of the second middle holes 61 is smaller than that of the first middle holes 36.

Illustratively, the section area of the second middle holes 61 is smaller than or equal to ¾ of the section area of the first middle holes 36. In such a manner, after the first filling layers 50 are removed subsequently, the second filling layers 60 on the side walls of the first middle holes 36 also can be etched off as the second filling layers 60 are smaller in thickness, such that on one hand, etching influences on the side walls of the first middle holes 36 can be reduced, on the other hand, guide wires 70 in the first middle holes 36 have greater section area. In such a manner, the influences on the conductive properties of the guide wires 70 can be reduced.

Referring to FIG. 23 to FIG. 28, the second filling layers 60 are formed in the first middle holes 36, the second filling layers 60 covering the exposed side walls of the first middle holes 36 and the tops of the remaining first filling layers 50. After second middle holes 61 are formed in the second filling layers 60, the second filling layers 60 and part of the first filling layers 50 are removed until the substrate 10 is exposed. The remaining first filling layers 50 form the first protective layers 80.

Figure 23:
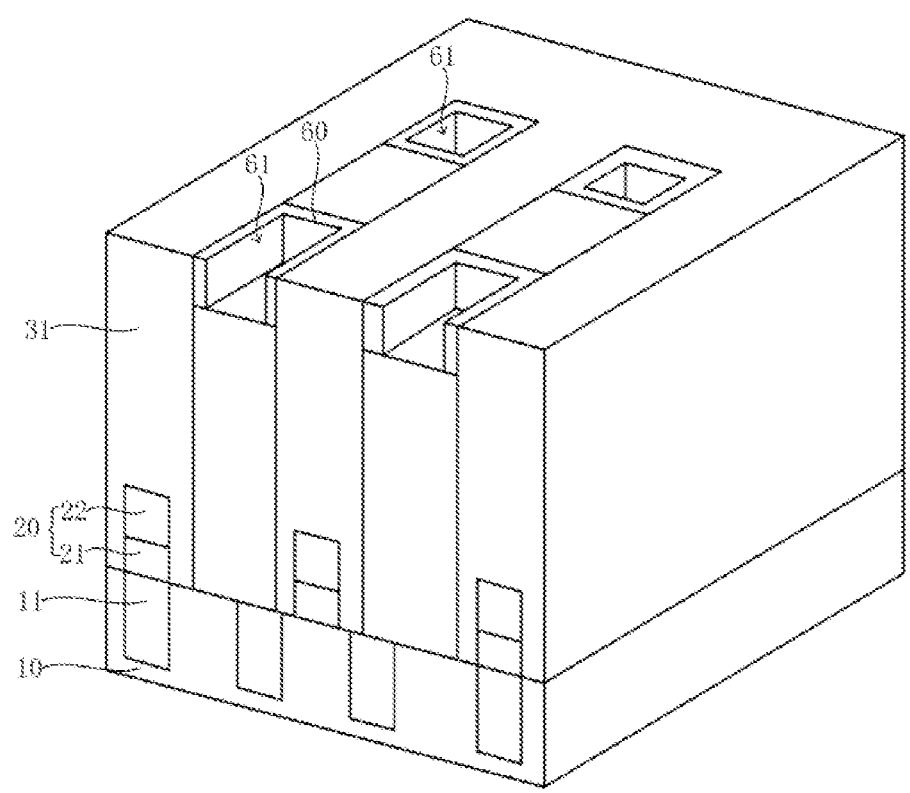
FIG. 23 is a structural schematic diagram after a second middle hole is formed in an embodiment of the present disclosure.
Figure 24:
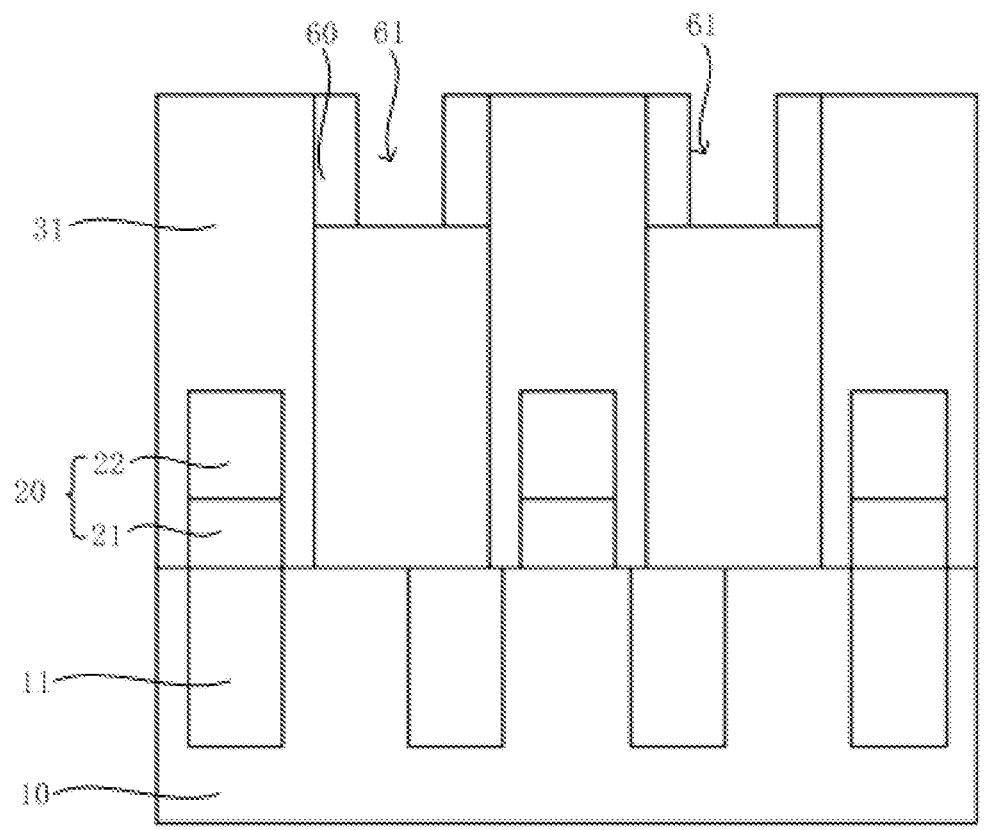
FIG. 24 is a front view of FIG. 23.
Figure 25:
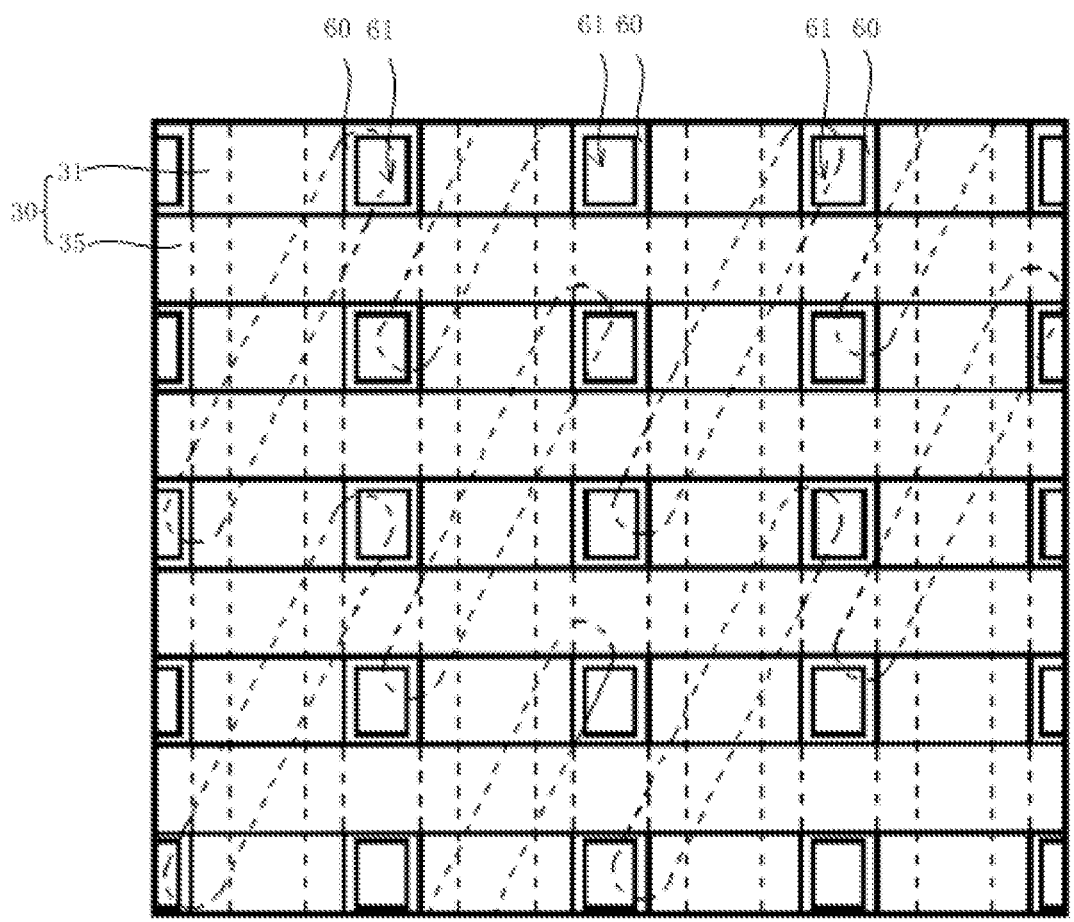
FIG. 25 is a top view of FIG. 23.

It should be noted that the second filling layers 60 are formed in the first middle holes 36, the second filling layers 60 covering the exposed side walls of the first middle holes 36 and the tops of the remaining first filling layers 50. After the second middle holes 61 are formed in the second filling layers 60, the second filling layers 60 and part of the first filling layers 50 are removed until the substrate 10 is exposed. Prior to the remaining first filling layers 50 forming the first protective layers 20, the second filling layer 60 on the supporting layers 30 and the second filling layer 60 on the hole bottoms of the second middle holes 36 are further removed to form a structure as shown in FIG. 23 to FIG. 25. In such a manner, the first filling layers 50 are exposed, such that the first filling layers 50 are conveniently removed along the second middle holes 61.

Taking the first middle holes 36 with the rectangular sections as an example, the operation of removing the second filling layers 60 and part of the first filling layers 50 until the substrate 10 is formed, and forming the first protective layers 80 by the remaining first filling layers 50 includes the following operations.

Figure 26:
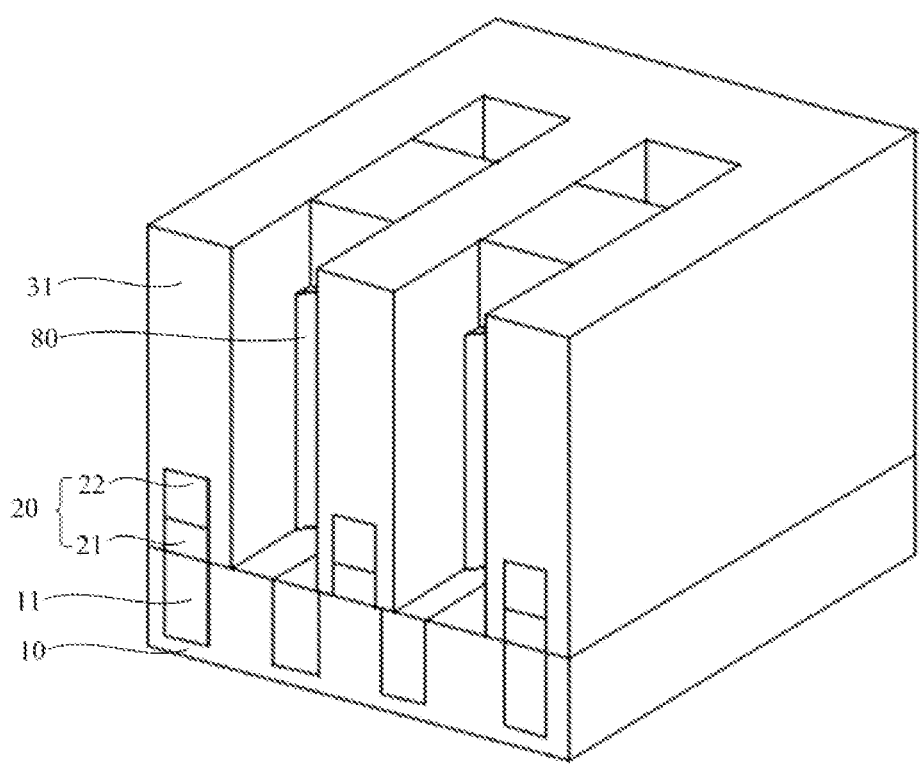
FIG. 26 is a structural schematic diagram after first protective layers are formed in an embodiment of the present disclosure.
Figure 27:
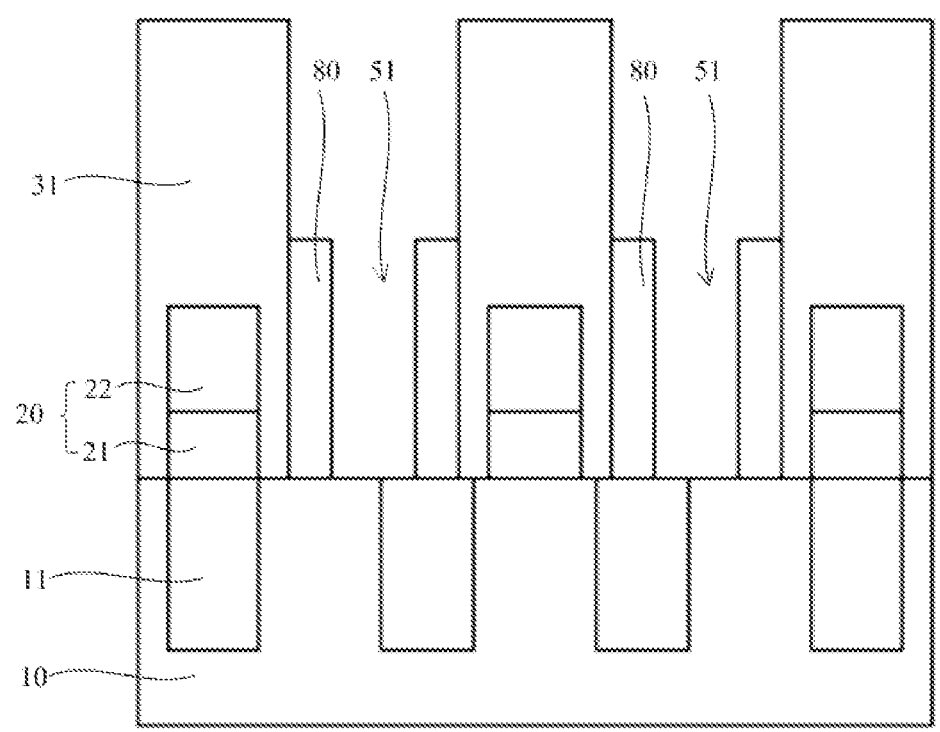
FIG. 27 is a front view of FIG. 26.
Figure 28:
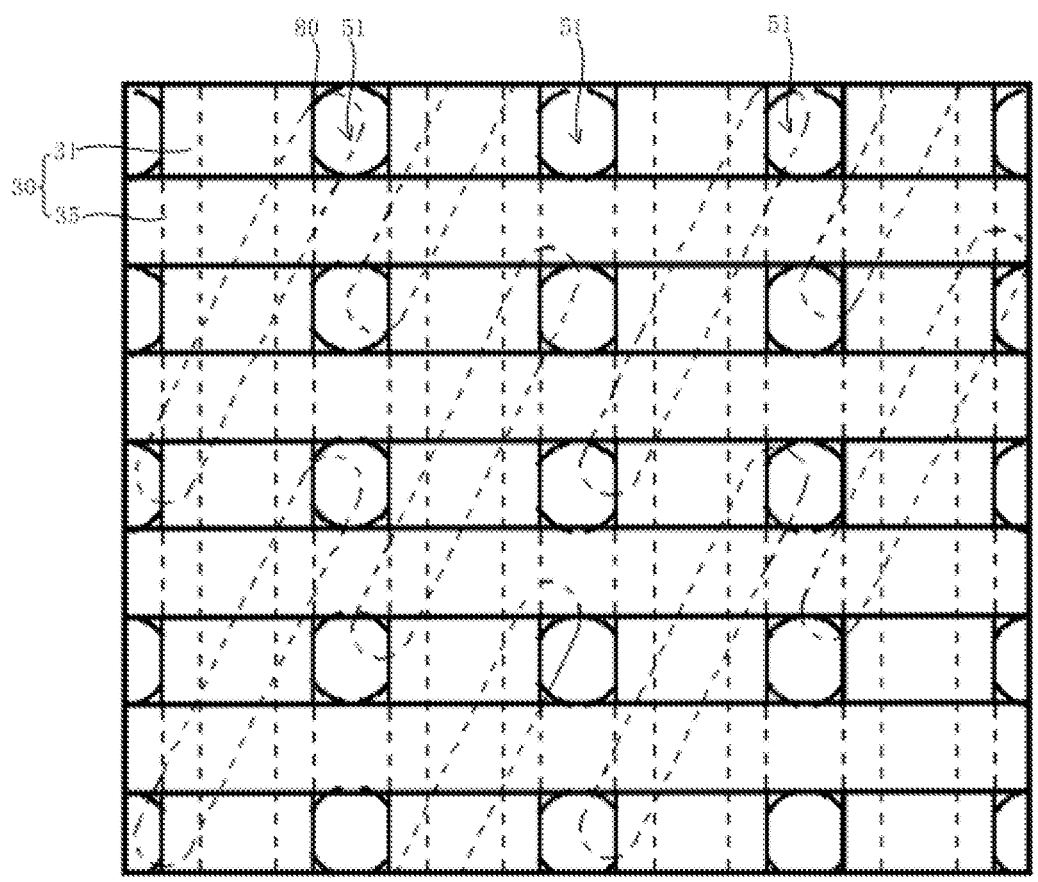
FIG. 28 is a top view of FIG. 26.

While the second filling layers 60 are removed along the first middle holes 36, first portions of the first filling layers 50 are removed along the second middle holes 61. The second portions of the first filling layers 50 are removed until the substrate 10 is exposed. The remaining third portions in the first filling layers 50 form the first protective layers 80 to form a structure as shown in FIG. 26 to FIG. 28.

Illustratively, when the second filling layers 60 are removed along the first middle holes 36, portions opposite to the second middle holes 61 in the first filling layers 50 are removed along the second middle holes 61, the portions being the first portions of the first filling layers 50. The height of the first portions is consistent with the height of the removed second filling layers 60. It should be understood that the substrate 10 is not exposed from the first filling layers 50. After the first portions of the first filling layers 50 are removed, the first filling layers 50 form protrusions fitted to the first middle holes 36.

The first filling layers 50 are continuously removed until the substrate 10 is exposed. In the process, the portions opposite to the second middle holes 61 in the remaining first filling layers 50 are removed along the second middle holes 61, and part of the protrusions of the first filling layers 50 are removed along the first middle holes 36. The portions in the first filling layers 50 and part of the protrusions are second portions of the first filling layer 50.

After the second portions of the first filling layers 50 are removed, the portion between every two adjacent side walls in each of the first middle holes 36 in each of the first filling layers 50 is retained, the portion being a third portion of each of the first filling layer 50. The third portions can be a plurality of first protective layer sub blocks, each of the plurality of the first protective layer sub blocks being connected to adjacent two side walls in each of the first middle holes 36. It should be understood that each of the first protective layer sub blocks is correspondingly distributed on each corner of each first middle hole 36. The first protective layer sub blocks together constitute the first protective layers 80.

The first portions and the second portions of the first filling layer 50 can be removed through dry etching. After the first portions and the second portions are etched, etching holes 51 which communicate with part of the substrate 10 and the active regions 11 are formed in the first filling layers 50. The side walls of the etching holes 51 include the inner side surfaces of the first filling layers 50 and the inner walls of part of the first middle holes 36. The first filling layers 50 are provided with a greater etching depth, such that the inner side surfaces of the first filling layers 50 form arc surfaces, i.e., every two adjacent side walls of each first middle hole 36 are in rounded transition through the corresponding first protective layer 80 to form a structure as shown in FIG. 26.

The first middle holes 36 and the etching holes 51 form step structures, such that when guide wires 70 are subsequently formed in the first middle holes 36 and the etching holes 51, the section area of the guide wires in the first middle holes 36 is greater, and the resistance of the guide wires 70 can be reduced.

At S105, the substrate 10 exposed in the etching holes 51 and the active regions 11 are etched along the etching holes 51 to form contact grooves 12.

Figure 29:
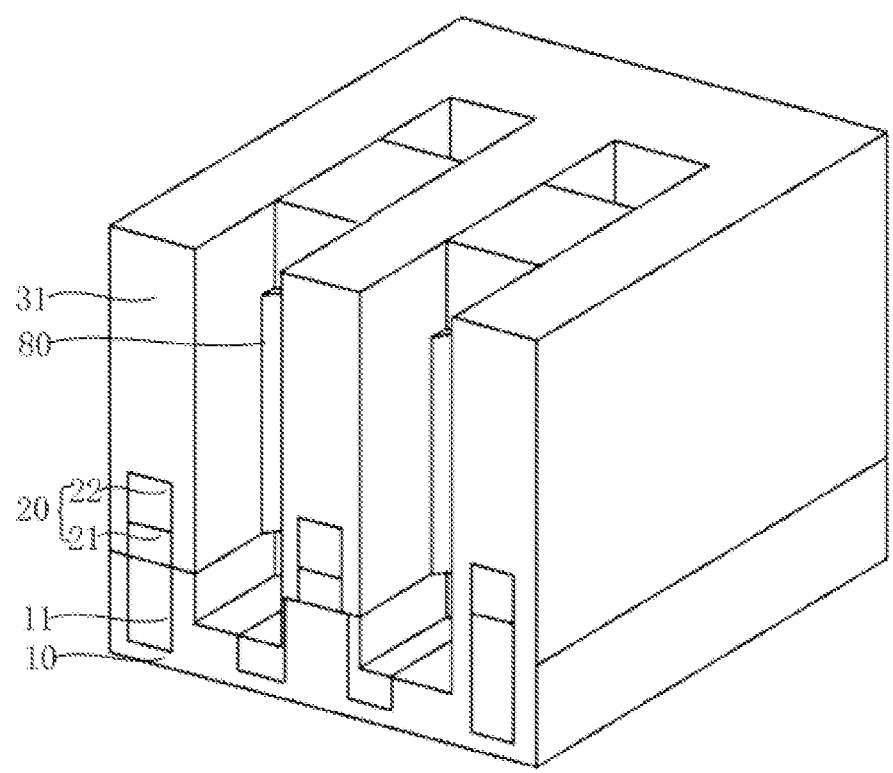
FIG. 29 is a structural schematic diagram after contact grooves are formed in an embodiment of the present disclosure.
Figure 30:
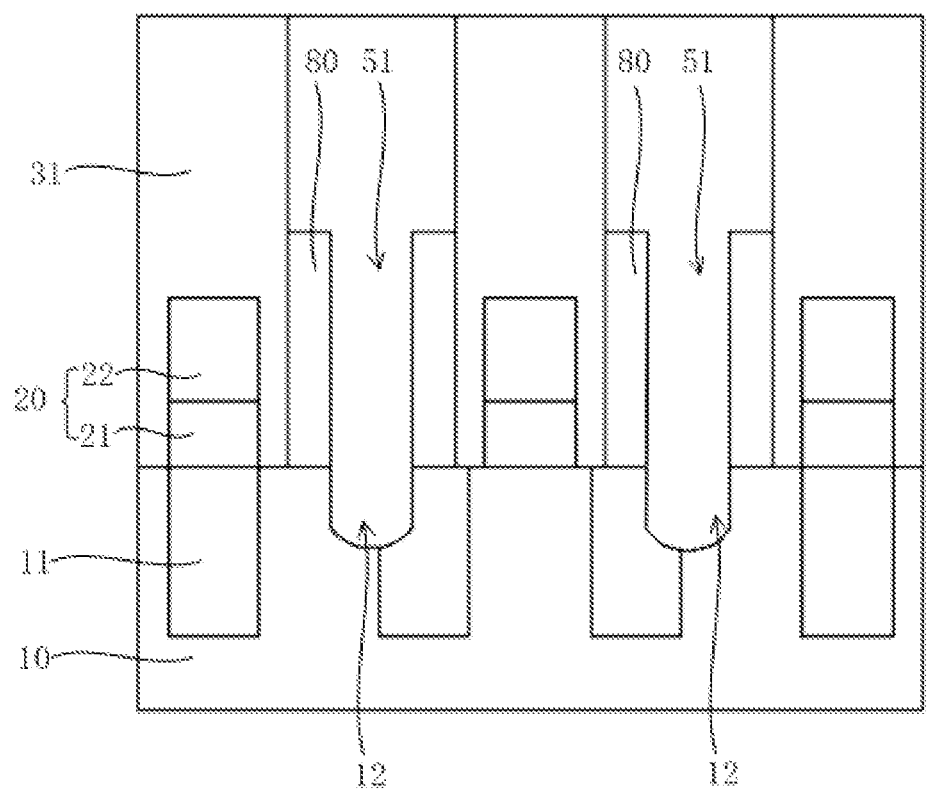
FIG. 30 is a front view of FIG. 29.
Figure 31:
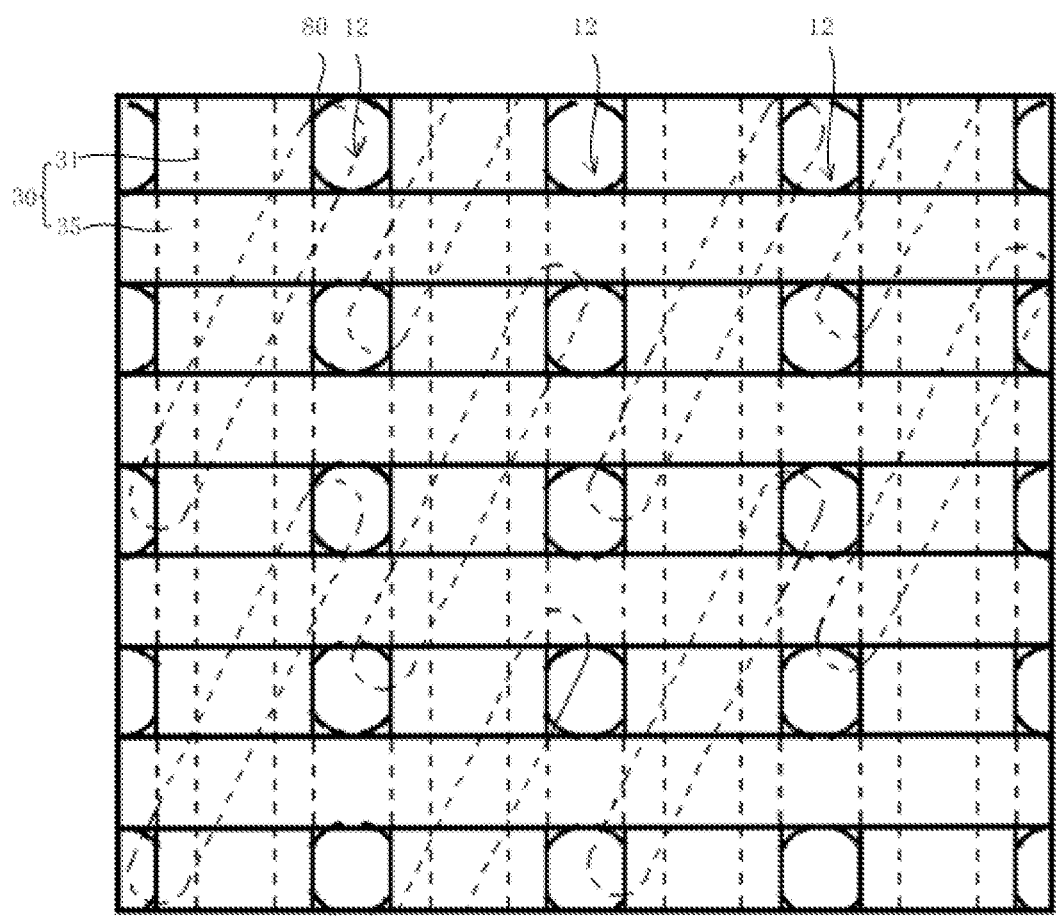
FIG. 31 is a top view of FIG. 29.

Referring to FIG. 29 to FIG. 31, the substrate 10 and the active regions 11 are etched along the etching holes 51 to form the contact grooves 12. Part of the side surfaces and the bottom surfaces of the contact grooves 12 are the active regions 11, specifically the second contact region 112. The greater the depth of the contact grooves 12, the greater the exposed surface area of the second contact region 112 in the active regions 11, the greater the contact area between the guide wires 70 filled into the contact grooves 12 and the active regions 11, and the smaller the contact resistance between the guide wires 70 and the active regions 11, such that the conductive performance of the guide wires 70 is better.

It should be understood that the possibility that the active regions 11 are transversely broken through as shown in FIG. 30 in the presence of the first protective layers 80.

At S106, the guide wires 70 configured to electrically connect to the active regions 11 are formed in the first middle holes 36, the etching holes 51 and the contact grooves 12.

Figure 32:
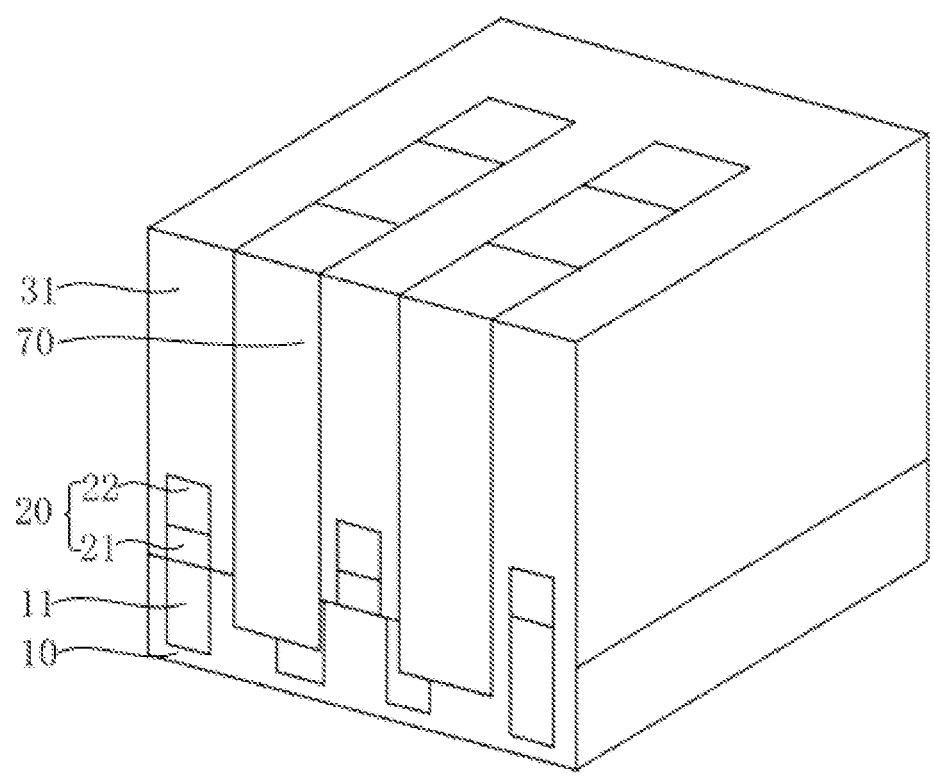
FIG. 32 is a structural schematic diagram of a memory in an embodiment of the present disclosure.
Figure 33:
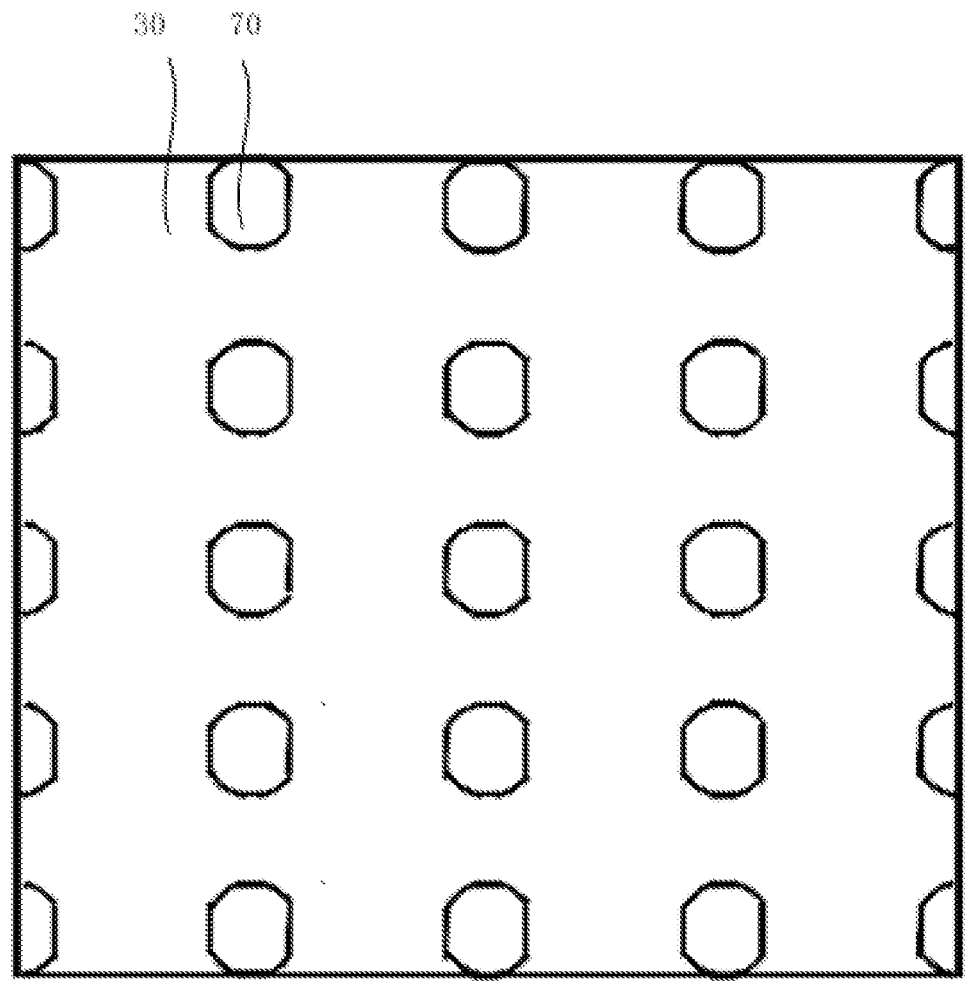
FIG. 33 is a top view of FIG. 32.

Referring to FIG. 32 and FIG. 33, the materials of the guide wires 70 can be polycrystalline silicon, the guide wires 70 being deposited in the first middle holes 36, the etching holes 51 and the contact grooves 12.

It should be noted that the material of the first protective layers 80 can be oxide, and the material of the supporting layer 30 can be nitride. At the step S105, before the substrate 10 exposed in the etching holes 51 and the active regions 11 are etched along the etching holes 51 to form the contact grooves 12, the first protective layers 80 are subjected to nitriding treatment, such that the material of the first protective layers 80 is the same with that of the supporting layer 30. In such a manner, the first protective layers 80 and the supporting layer 30 can form an integer.

Specifically, the first protective layers 80 are subjected to nitriding treatment by taking NH3 as plasma nitriding gas under conditions, for example, plasma strength of 600-2000 W, a nitriding treatment temperature of 600-800° C., and nitriding treatment pressure of 1-10 pa.

Figure 34:
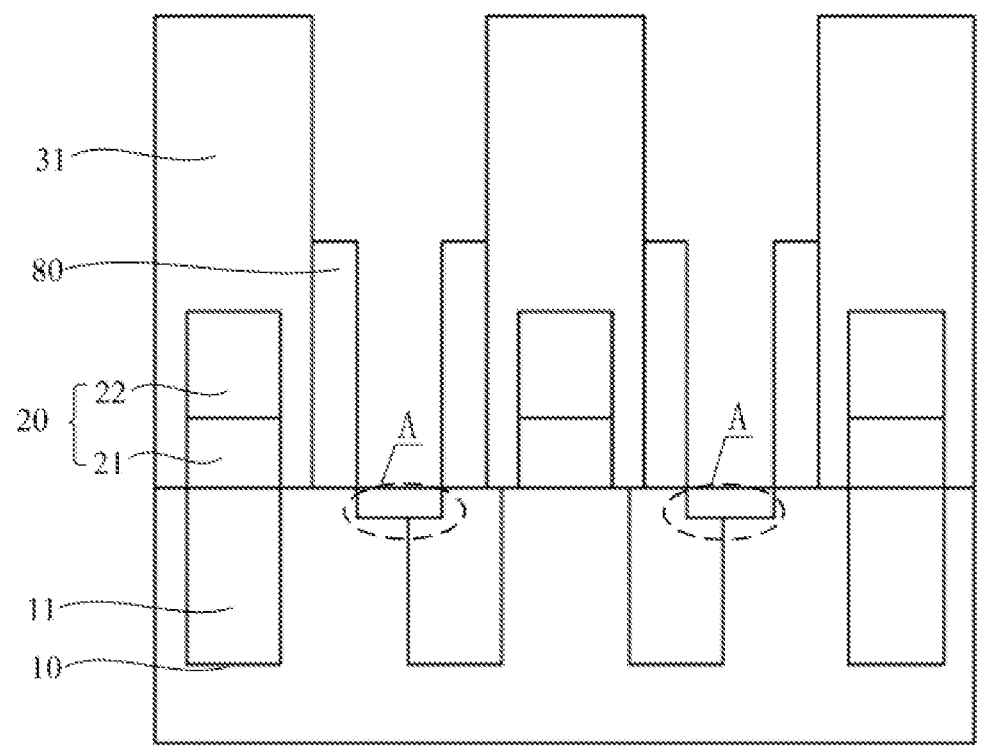
FIG. 34 is a structural schematic diagram after a transformation region is formed in an embodiment of the present disclosure.

It should be noted that when the material of the substrate 10 is silicon oxide and the material of the active regions 11 is silicon, nitriding treatment is performed on the first protective layers 80, such that part of the substrate 10 and the active regions 11 will be transformed. That is, in the substrate 10 and the active regions 11, the portions corresponding to the etching holes 51 are also transformed into silicon nitride. A transformation region A as shown by virtual lines in FIG. 34 is a transformed silicon nitride region. In the follow-up etching along the etching holes 51, the transformation region A will be removed.

In a method for manufacturing a memory provided in the embodiment of the present disclosure, a substrate 10 including active regions 11 is provided, a BL 20 in contact with part of the active regions 11 and a supporting layer 30 covering the BL 20 and the substrate 10 are formed over the substrate 10, and first middle holes 36 penetrating through the supporting layer 30 and extending to the active regions 11 are formed in the supporting layer 30. First protective layers 80 are formed in the first middle holes 36, such that the substrate 10 and the active regions 11 exposed in etching holes 51 are etched through the etching holes 51 communicating with the substrate 10 in the first protective layers 80. While the contact grooves 12 are formed, the side walls of the contact grooves 12 are not easily etched. After guide wires 70 configured to electrically connect the active regions 11 are formed in the first middle holes 36, the etching holes 51 and the contact grooves 12, the guide wires 70 can be prevented from directly communicating with the BL 20, such that the yield of a memory is increased.

Embodiment 2

Referring to FIG. 29 to FIG. 33, the embodiment of the present disclosure provides a memory. FIG. 32 is a structural schematic diagram of a memory in an embodiment of the present disclosure.

The memory includes a substrate 10, BLs 20, a supporting layer 30 and first protective layers 80. The substrate 10 includes active regions 11 which can include a first contact region 111 electrically connected to the BLs 20 and a second contact region 112 electrically connected to guide wires 70, the first contact region 111 being positioned on the middle parts of the active regions 11, and the second contact region 112 being positioned on the two end parts of each of the active regions 11.

The BLs 20 are positioned over the substrate 10 and are in contact with part of the active regions 11. For example, each of the BLs 20 can be a conductive material which is in electric contact with the first contact region 111 in the active regions 11. Specifically, each of the BLs 20 includes a first sub body 21 close to the substrate 10 and a second sub body 22 in contact with the first sub body 21, the material of the first sub body 21 can be TiN. The material of the second sub body 22 can be W.

To increase storage density of the memory and improve storage efficiency of the memory, a plurality of active regions 11 can be arranged, and a plurality of BLs 20 can be arranged. One BL 20 passes through the first contact region 111 in several active regions 11, each active region 11 being in contact with one BL 20 at most. Illustratively, the plurality of BLs 20 are arranged in parallel, and the plurality of the active regions 11 are arranged in parallel, the positive projections, on the upper surface of the substrate 10, of the BLs 20 and the positive projections, on the upper surface of the substrate 10, of the active regions 11 are arranged in an inclined mode.

The supporting layer 30 covers the BLs 20 and the substrate 10. The supporting layer 30 is generally an insulating material, and is provided with guide wire holes penetrating through the supporting layer 30 for containing guide wires 70. The guide wires 70 can extend into the substrate 10, and can be in contact with part of the active regions 11, for example, the second contact region 112 in the active regions 11. Gaps are formed between the guide wire holes and the BLs 20, such that the guide wires 70 are not in direct communication with the BLs 20.

Specifically, in a direction perpendicular to the substrate 10, the guide wire holes include first middle holes 36, etching holes 51 and contact grooves 12 which are connected in sequence from top to bottom. The first middle holes 36 and the etching holes 51 are positioned in the supporting layer 30 over the substrate 10, and penetrate through the supporting layer 30. The contact grooves 12 are formed in the substrate 10. The plane parallel to the surface of the substrate 10 is taken as a section. The section area of the etching holes 51 is smaller than the section area of the first middle holes 36.

The first protective layers 80 are positioned on the inner walls of the guide wire holes and are in contact with the substrate 10. Referring to FIG. 30, the first protective layers 80 are positioned over the substrate 10, and are positioned between the inner side surfaces of the guide wire holes and the outer side surfaces of the guide wires 70. Specifically, the first protective layers 80 are positioned between the inner side surfaces of the etching holes 51 and the outer side surfaces of the guide wires 70.

The first protective layers 80 form at least part of the inner walls of the etching holes 51. Illustratively, the first protective layers 80 can circle around the first middle holes 36 in the peripheral direction of the first middle holes 36, and the inner walls of the first protective layers 80 are the inner walls of the etching holes 51. The first protective layers 80 also can be arranged at intervals in the peripheral direction of the first middle holes 36, such that the inner walls of the first protective layers 80 and the inner walls of the first middle holes 36 together constitute the inner walls of the etching holes 51.

Specifically, when the sections of the first middle holes 36 are in the shapes of polygons, the first protective layers 80 include a plurality of protective blocks. The plurality of the protective blocks are in contact with the substrate 10. Each of the protective blocks is connected to the two adjacent side walls of each of the first middle hole 36. Each protective block and the side walls of each of the first middle holes 36 form the side walls of each etching holes 51. The side walls of the protective blocks are alternatively connected to the side walls of the first middle holes 36 to form the side walls of the etching holes 51.

The surface, away from the two side walls of each of the first middle holes 36 connected to each protective block, of the protective block is an arc surface, i.e., the surface, facing towards the center line of each first middle hole 36, of each protective block is an arc surface. Adjacent two side walls of each first middle hole 36 are in circular-arc transition through the side walls of the first protective block, and the part of the inner wall of the formed etching hole 51 is an arc surface. In such a manner, while the guide wires 70 are prevented from being in contact with the BLs 20, the section area of the etching holes 51 is greater, such that the guide wires 70 have greater section area, and the resistance of the guide wires 70 is reduced.

It should be noted that the height of the etching holes 51 can be smaller than that of the first middle holes 36, i.e., the upper surfaces of the etching holes 51 are lower than the upper surfaces of the first middle holes 36. In such a manner, the upper parts of the guide wires 70 have greater section area, such that the resistance of the guide wires 70 is further reduced.

In the memory provided in the embodiment of the present disclosure, the active regions 11 are arranged over the substrate 10, the BLs 20 in contact with part of the active regions 11 are arranged over the substrate 10, and a supporting layer 30 covers the BLs 20 and the substrate 10 for protecting and electrically insulating the BLs 20. The guide wire holes penetrating through the supporting layer 30 are further formed in the supporting layer 30, and the guide wires 70 are arranged in the guide wire holes and extend into the substrate 10, and are in contact with the active regions 11 of the substrate 10. The first protective layers 80 are arranged on the outer side surfaces of the guide wires 70 and the inner side surfaces of the guide wire holes to prevent the guide wires 70 from being in direct communication with the BLs 20, such that the yield of the memory is further increased.

Finally, it should be noted that the above embodiments are only used to illustrate the technical solutions of the present disclosure and shall not be construed as limitation. Although the present disclosure has been described in detail with reference to the foregoing embodiments, a person of ordinary skill in the art should understand that modifications or equivalent substitutions can be made on the technical solutions recorded in the embodiments or part of all technical features herein, all of which do not deviate the technical solutions from the scope of the technical solutions embodied in the embodiments of the present disclosure.

What is claimed is:

1. A method for manufacturing a memory device, comprising:

providing a substrate, the substrate comprising active regions;

forming Bit Lines (BLs) over the substrate, the BLs covering part of the active regions;

forming a supporting layer over the substrate covering the BLs and the substrate, first middle holes penetrating through the supporting layer and extending into the active regions being formed in the supporting layer, and gaps being formed between the first middle holes and the BLs;

forming first protective layers in the first middle holes, and forming etching holes communicating with the substrate in the first protective layers, such that portions of the active regions are exposed in the etching holes;

etching the substrate and the active regions exposed in the etching holes along the etching holes to form contact grooves; and forming guide wires configured to electrically connect to the active regions in the first middle holes, the etching holes and the contact grooves.

2. The method for manufacturing a memory device according to claim 1, wherein a plane parallel to the substrate is adopted as a section, and a shape of the first middle holes is a polygon;

a step of forming the first protective layers in the first middle holes comprises:

forming first filling layers in the first middle holes and on the surface of the supporting layer; and removing part of the first filling layers on the surface of the supporting layer and in the first middle holes to form first protective layers.

3. The method for manufacturing a memory device according to claim 2, wherein a step of removing part of the first filling layers on the surface of the supporting layer and in the first middle holes to form the first protective layers comprises:

removing part of the first filling layers in the first middle holes to expose part of the side walls of the first middle holes;

forming second filling layers in the first middle holes, the second filling layers covering exposed side walls of the first middle holes and top portions of remaining first filling layers, and second middle holes being formed in the second filling layers; and removing the second filling layers and part of the first filling layers until the substrate is exposed, and forming the first protective layers with remaining first filling layers.

4. The method for manufacturing a memory device according to claim 3, wherein a step of removing part of the first filling layers in the first middle holes to expose part of the side walls of the first middle holes comprises: making a height of the exposed side walls of the first middle holes to be ⅕ to ¼ of a height of whole side walls of the first middle holes.

5. The method for manufacturing a memory device according to claim 3, wherein a step of removing the second filling layers and part of the first filling layers until the substrate is exposed, and forming the first protective layers with remaining first filling layers comprises:

removing first portions of the first filling layers along second middle holes while removing the second filling layers along the first middle holes; and removing second portions of the first filling layers until the substrate is exposed, and forming the first protective layers with remaining third portions of the first filling layers.

6. The method for manufacturing a memory device according to claim 5, wherein a step of removing the second portions of the first filling layers until the substrate is exposed, and forming the first protective layers with remaining third portions of the first filling layers comprises:

removing second portions of the first filling layers until the substrate is exposed, retaining third portions of the first filling layers between every two adjacent side walls in the first middle holes as first protective layer sub blocks, the first protective layer sub blocks collectively forming the first protective layer.

7. The method for manufacturing a memory device according to claim 1, wherein the substrate and the active regions exposed in the etching holes are etched along the etching holes to form contact grooves in a case that a material of the first protective layers comprises silicon oxide and the material of the supporting layer comprises silicon nitride; and prior to forming contact grooves, the method for manufacturing a memory device further comprises:

performing nitriding treatment on the first protective layers, such that a material of the first protective layers is same as that of the supporting layer.

8. The method for manufacturing a memory device according to claim 1, wherein a plurality of BLs are arranged over the substrate;

a step of forming a supporting layer covering the BLs and the substrate over the substrate, forming first middle holes penetrating through the supporting layer and extending into the active region in the supporting layer, and forming gaps between the first middle holes and the BLs comprises:

forming first supporting pads respectively covering the BLs over the substrate;

forming a sacrificial layer to fill up the gaps between the first supporting pads;

forming first filling holes in the sacrificial layer;

forming a second supporting pad in the firs filling hole, wherein the second supporting pad and the first supporting pad have the same height, and together constitute the supporting layer; and removing the sacrificial layer to form the first middle holes in the supporting layer.

9. The method for manufacturing a memory device according to claim 8, wherein a step of forming the first filling holes in the sacrificial layer comprises:

forming a mask layer in the sacrificial layer; and etching the sacrificial layer with the mask layer to form the first filling holes extending to the substrate; and removing the mask layer.

10. A memory device, comprising:

a substrate, the substrate comprising active regions;

Bit Lines (BLs), the BLs being positioned over the substrate and in contact with part of the active regions;

a supporting layer, the supporting layer covering the BLs and the substrate, the supporting layer being provided with guide wire holes penetrating through the supporting layer, and guide wires extending into the substrate and in contact with the active regions being arranged in the guide wire holes; and first protective layers, the first protective layers being positioned on the inner walls of the guide wire holes and over the substrate;

wherein the memory device is prepared with steps of:

providing the substrate, the substrate comprising active regions;

forming the BLs over the substrate, the BLs covering part of the active regions;

forming the supporting layer over the substrate covering the BLs and the substrate, first middle holes penetrating through the supporting layer and extending into the active regions being formed in the supporting layer, and gaps being formed between the first middle holes and the BLs;

forming the first protective layers in the first middle holes, and forming etching holes communicating with the substrate in the first protective layers, such that portions of the active regions are exposed in the etching holes;

etching the substrate and the active regions exposed in the etching holes along the etching holes to form contact grooves; and forming the guide wires configured to electrically connect to the active regions in the first middle holes, the etching holes and the contact grooves.

11. The memory device of claim 10, wherein in a direction perpendicular to the substrate, the guide wire holes comprise the first middle holes, the etching holes and the contact grooves which are connected in sequence; and the first middle holes and the etching holes are positioned in the supporting layer on the substrate, and the contact grooves are positioned in the substrate.

12. The memory device of claim 11, wherein a plane parallel to the substrate is taken as a section, and a shape of the first middle holes is a polygon; and the first protective layers form at least part of the inner walls of the etching holes.

13. The memory device of claim 12, wherein at least part of the inner walls of the etching holes have arc surfaces.

* * * * *